(12) United States Patent
Iwaki et al.

(10) Patent No.: US 10,672,609 B2
(45) Date of Patent: Jun. 2, 2020

(54) DISPLAY DEVICE, DRIVING METHOD OF THE SAME, AND ELECTRONIC DEVICE

(71) Applicant: Semiconductor Energy Laboratory Co., Ltd., Atsugi-shi, Kanagawa-ken (JP)

(72) Inventors: Yuji Iwaki, Isehara (JP); Daisuke Kubota, Atsugi (JP); Kentaro Hayashi, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/615,377

(22) Filed: Jun. 6, 2017

(65) Prior Publication Data

US 2017/0365461 A1 Dec. 21, 2017

(30) Foreign Application Priority Data

Jun. 15, 2016 (JP) .................. 2016-118722

(51) Int. Cl.
*H01L 21/027* (2006.01)
*G09G 3/34* (2006.01)
(Continued)

(52) U.S. Cl.
CPC ............ *H01L 21/0271* (2013.01); *G01J 1/44* (2013.01); *G06F 7/575* (2013.01); *G06T 1/20* (2013.01);
(Continued)

(58) Field of Classification Search
CPC ........ H01L 21/0271; G01J 1/44; G06F 7/575; G06T 1/20; G09G 3/2074; G09G 3/34;
(Continued)

(56) References Cited

U.S. PATENT DOCUMENTS 6,714,268 B2 3/2004 Wang et al.
7,038,641 B2 5/2006 Hirota et al.
(Continued)

FOREIGN PATENT DOCUMENTS

JP 2001-066593 A 3/2001
JP 2002-196702 A 7/2002
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Jennifer Mehmood
*Assistant Examiner* — Ngan T Pham Lu
(74) *Attorney, Agent, or Firm* — Robinson Intellectual Property Law Office; Eric J. Robinson

(57) ABSTRACT

A display device which can display a clear image and can display an image with low power consumption is provided. The display device includes an arithmetic circuit having a function of generating first to third display data, a first display portion, and a second display portion. The arithmetic circuit has a function of detecting a color region and a gray-scale region of the generated first display data and generating the second display data corresponding to an image to be displayed on the first display portion and the third display data corresponding to an image to be displayed on the second display portion, on the basis of the detection results.

25 Claims, 20 Drawing Sheets

(51) Int. Cl.
| | |
|---|---|
| *G09G 3/36* | (2006.01) |
| *G01J 1/44* | (2006.01) |
| *G06F 7/575* | (2006.01) |
| *G06T 1/20* | (2006.01) |
| *G09G 3/20* | (2006.01) |
| *G01J 1/32* | (2006.01) |
| *H01L 27/12* | (2006.01) |
| *H01L 29/786* | (2006.01) |
| *G09G 5/36* | (2006.01) |

(52) U.S. Cl.
CPC ............ *G09G 3/2074* (2013.01); *G09G 3/34* (2013.01); *G09G 3/3426* (2013.01); *G09G 3/3648* (2013.01); *G01J 1/32* (2013.01); *G09G 3/2096* (2013.01); *G09G 5/36* (2013.01); *G09G 2300/023* (2013.01); *G09G 2300/0452* (2013.01); *G09G 2320/0238* (2013.01); *G09G 2320/0242* (2013.01); *G09G 2320/0271* (2013.01); *G09G 2360/128* (2013.01); *G09G 2360/144* (2013.01); *G09G 2360/18* (2013.01); *H01L 27/1225* (2013.01); *H01L 29/7869* (2013.01); *H01L 29/78648* (2013.01)

(58) Field of Classification Search
CPC .... G09G 3/3426; G09G 3/3648; G09G 3/342; G09G 3/3413
USPC .......................................................... 345/89
See application file for complete search history.

(56) References Cited

U.S. PATENT DOCUMENTS

| | | | |
|---|---|---|---|
| 7,084,936 B2 | 8/2006 | Kato | |
| 7,102,704 B2 | 9/2006 | Mitsui et al. | |
| 7,106,893 B2* | 9/2006 | Bankman | G06T 7/11 |
| | | | 382/128 |
| 7,176,991 B2 | 2/2007 | Mitsui et al. | |
| 7,239,361 B2 | 7/2007 | Kato | |
| 7,248,235 B2* | 7/2007 | Fujii | G02F 1/133555 |
| | | | 345/76 |
| 7,385,654 B2 | 6/2008 | Mitsui et al. | |
| 9,349,325 B2 | 5/2016 | Yamazaki et al. | |
| 2003/0201960 A1 | 10/2003 | Fujieda | |
| 2006/0072047 A1 | 4/2006 | Sekiguchi | |
| 2008/0088649 A1* | 4/2008 | Ikeno | G09G 3/3611 |
| | | | 345/690 |
| 2008/0180618 A1 | 7/2008 | Fujieda | |
| 2010/0171905 A1 | 7/2010 | Huang et al. | |
| 2012/0093401 A1* | 4/2012 | Tsunematsu | G06T 9/20 |
| | | | 382/165 |
| 2013/0235030 A1* | 9/2013 | Fujisawa | G06T 15/00 |
| | | | 345/419 |
| 2015/0093031 A1* | 4/2015 | Konishi | G06K 9/00442 |
| | | | 382/190 |
| 2017/0352540 A1 | 12/2017 | Watanabe et al. | |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2011-248351 A | 12/2011 |
| JP | 2013-221965 A | 10/2013 |
| WO | WO-2004/053819 | 6/2004 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Shieh.H, "Transflective display by Hybrid OLED and LCD", LEOS 2005 (IEEE Lasers and Electro-Optics Society Annual Meeting) , Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

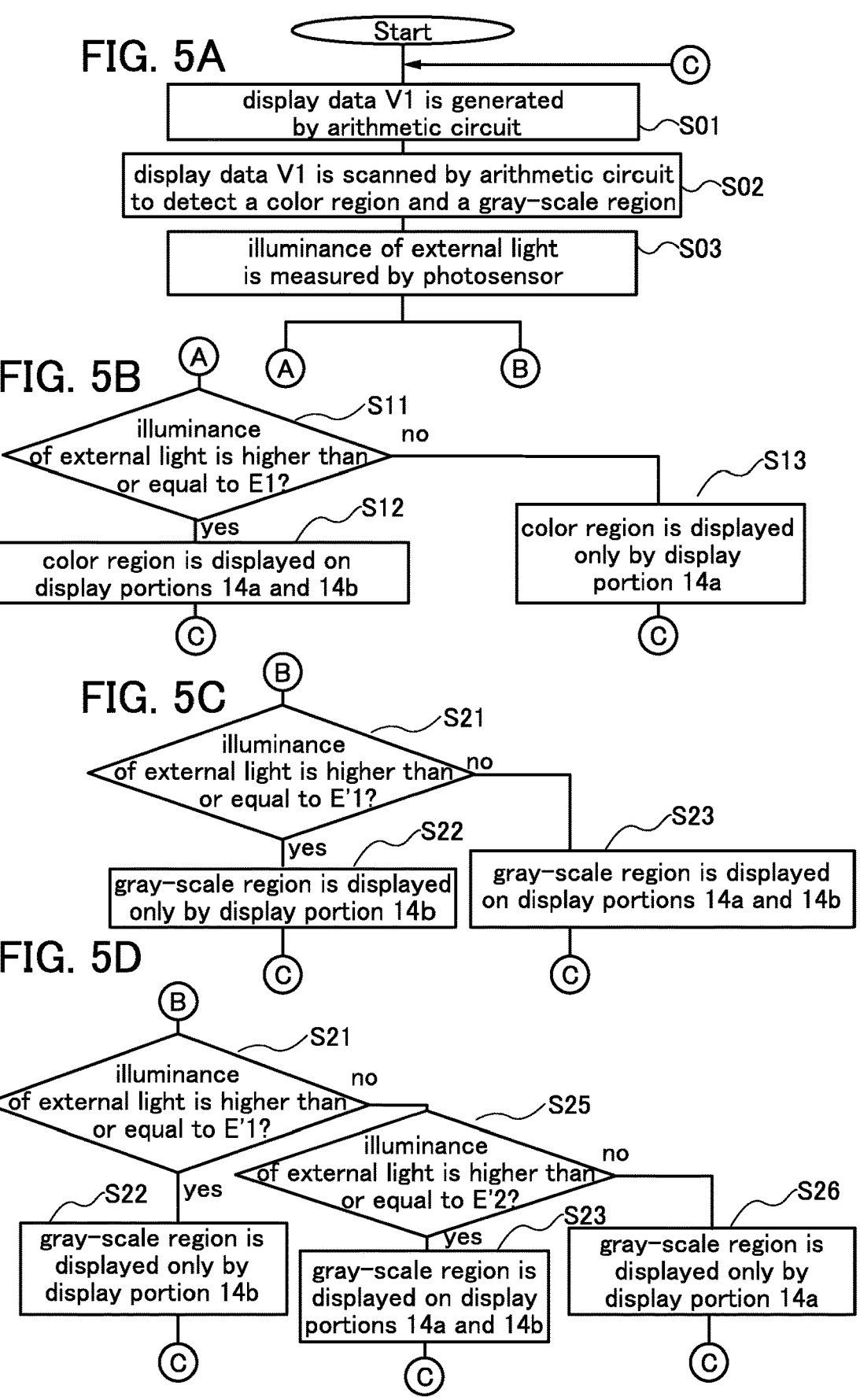

FIG. 16A1 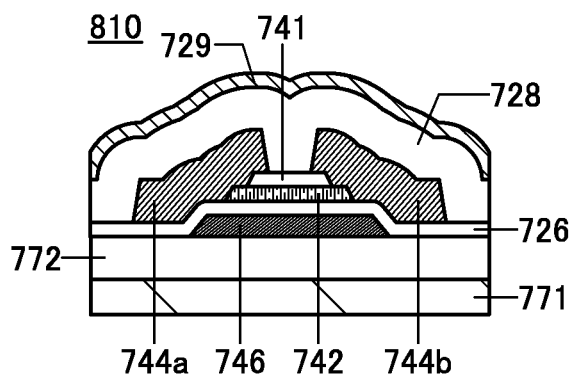
FIG. 16A2 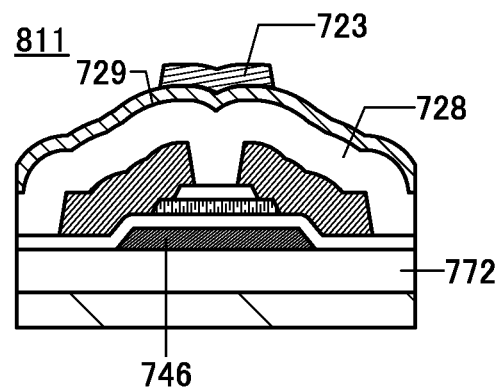
FIG. 16B1 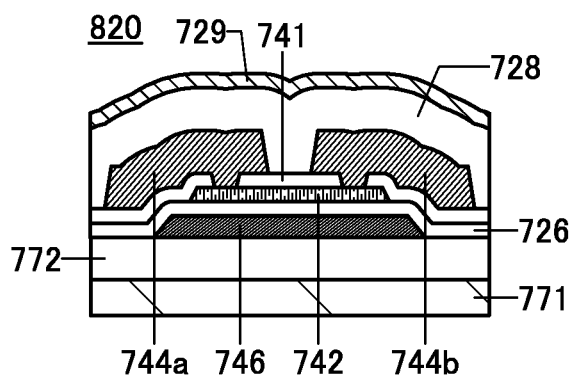
FIG. 16B2 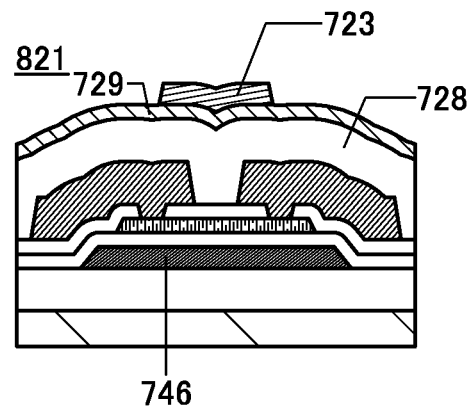
FIG. 16C1 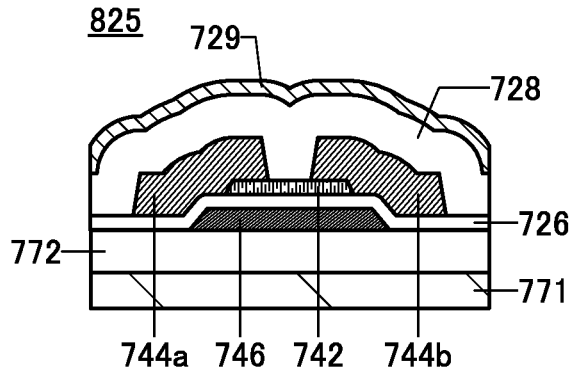
FIG. 16C2 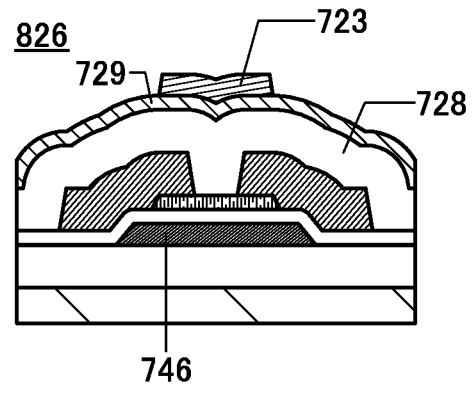

FIG. 17A1
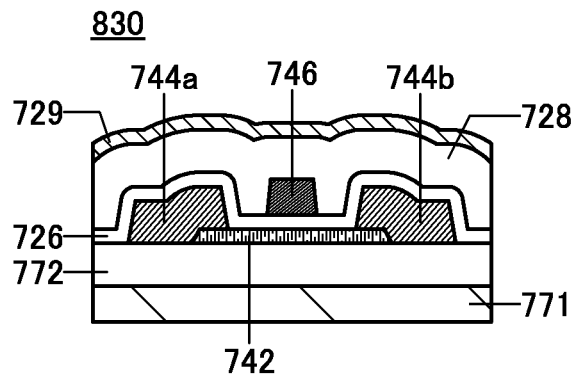
FIG. 17A2
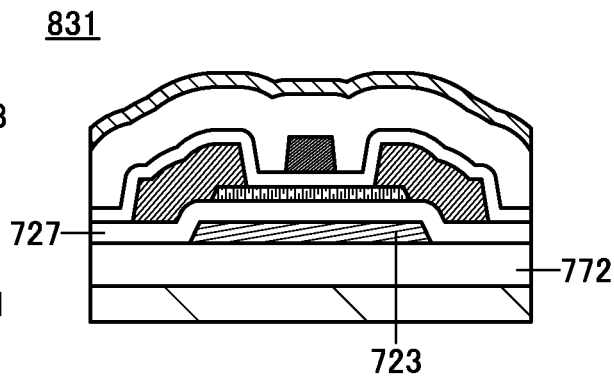
FIG. 17A3
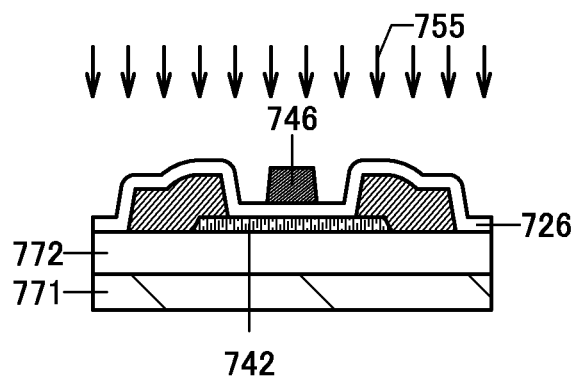
FIG. 17B1
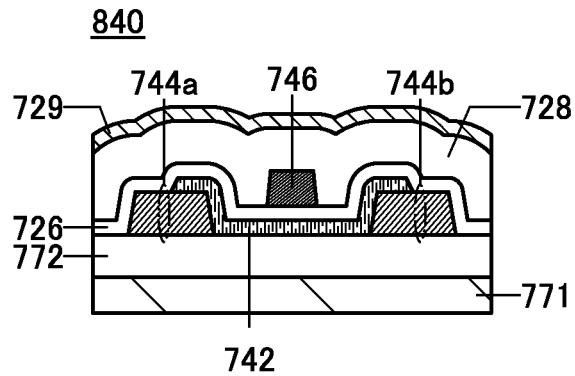
FIG. 17B2
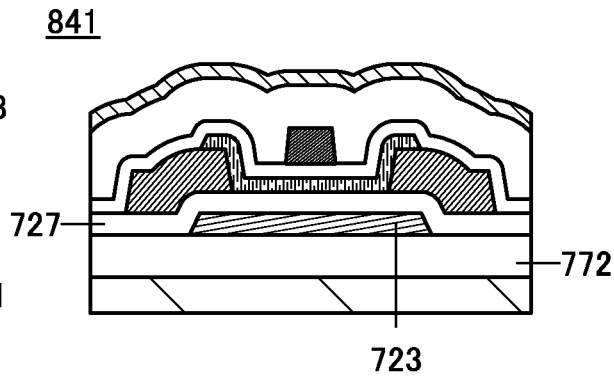

FIG. 18A1
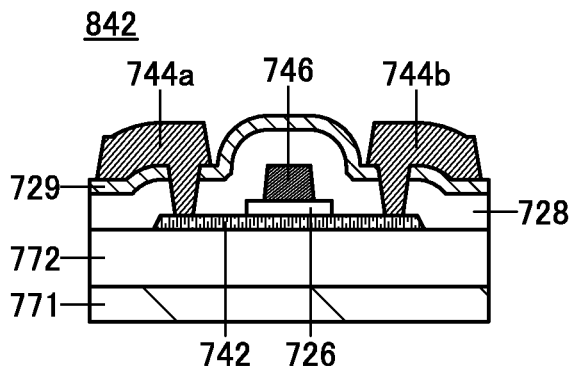
FIG. 18A2
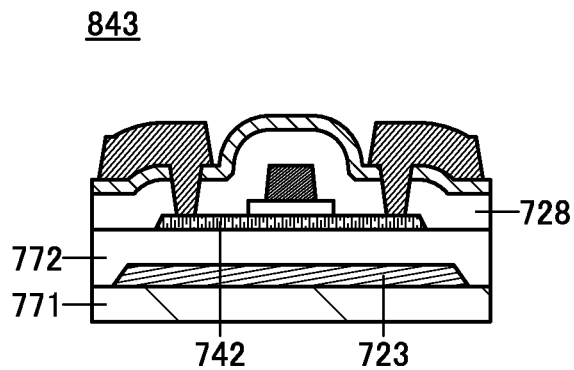
FIG. 18A3
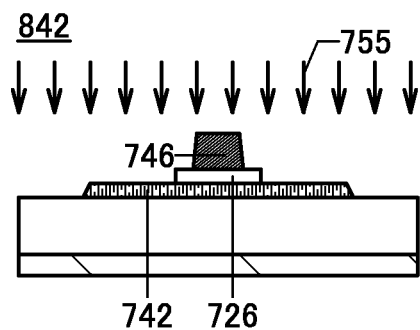
FIG. 18B1
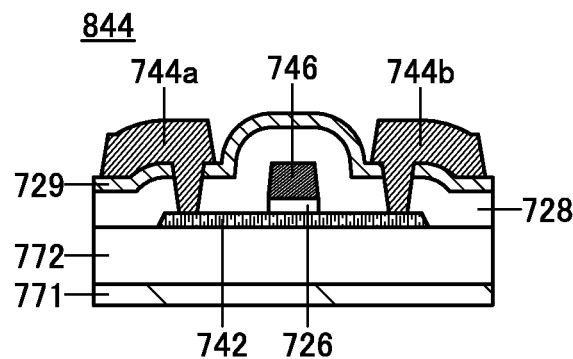
FIG. 18B2
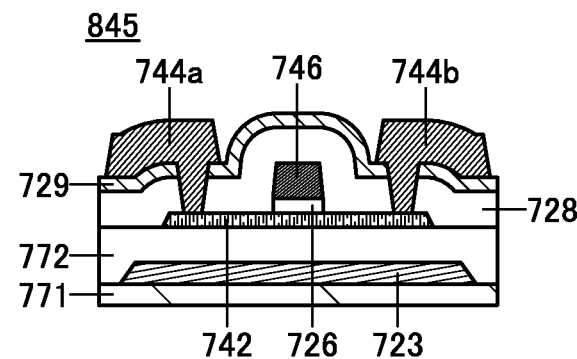
FIG. 18C1
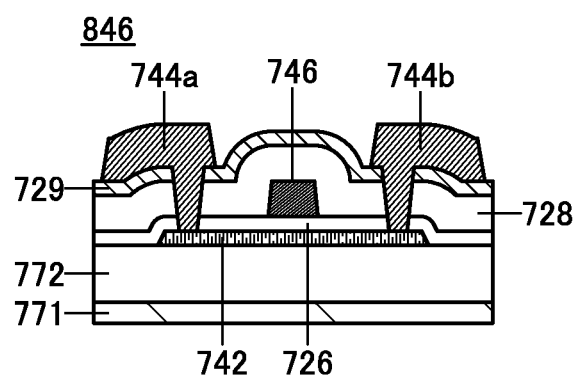
FIG. 18C2
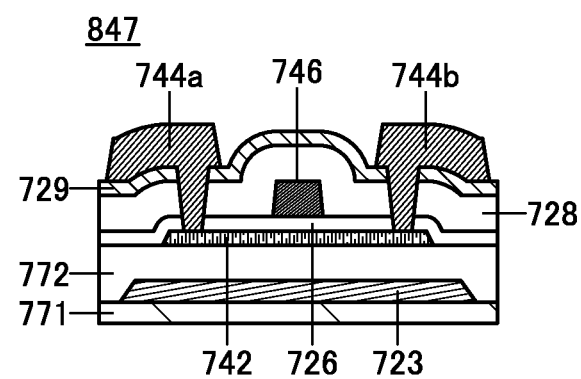

DISPLAY DEVICE, DRIVING METHOD OF THE SAME, AND ELECTRONIC DEVICE

BACKGROUND OF THE INVENTION

1. Field of the Invention

One embodiment of the present invention relates to a display device, a driving method thereof, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification and the like include a semiconductor device, a display device, a light-emitting device, a power storage device, a memory device, a method for driving any of them, and a method for manufacturing any of them.

2. Description of the Related Art

A liquid crystal display device in which a surface-emitting light source is provided as a backlight and combined with a transmissive liquid crystal display device in order to reduce power consumption and suppress a reduction in display quality is known (see Patent Document 1)

REFERENCE

Patent Document

[Patent Document 1] Japanese Published Patent Application No. 2011-248351

SUMMARY OF THE INVENTION

An object of one embodiment of the present invention is to provide a display device capable of displaying an image with high brightness and a driving method thereof. An object of one embodiment of the present invention is to provide a display device capable of displaying an image with high contrast and a driving method thereof. An object of one embodiment of the present invention is to provide a display device capable of displaying a clear image and a driving method thereof. An object of one embodiment of the present invention is to provide a display device with low power consumption and a driving method thereof. An object of one embodiment of the present invention is to provide a display device with pixels capable of retaining display data for a long time and a driving method thereof. An object of one embodiment of the present invention is to provide a display device which can be manufactured through simple process and a driving method thereof. An object of one embodiment of the present invention is to provide a novel display device and a driving method thereof.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first circuit, a second circuit, a first display portion, and a second display portion. The first circuit is configured to generate first display data. The first circuit is configured to detect a color region of the first display data and a gray-scale region of the first display data. The first circuit is configured to generate second display data and third display data on the basis of data relating to the color region of the first display data and data relating to the gray-scale region of the first display data. The first circuit is configured to send the second display data to the second circuit. The first circuit is configured to send the third display data to the second circuit. The second circuit is configured to send the second display data received from the first circuit to the first display portion. The second circuit is configured to send the third display data received from the first circuit to the second display portion. The first display portion is configured to display an image corresponding to the second display data. The second display portion is configured to display an image corresponding to the third display data. The first display portion and the second display portion are stacked.

The display device may further include a third circuit and a fourth circuit. The second circuit may be configured to write the second display data received from the first circuit to the third circuit. The second circuit may be configured to send the second display data read out from the third circuit to the first display portion. The second circuit may be configured to write the third display data received from the first circuit to the fourth circuit. The second circuit may be configured to send the third display data read out from the fourth circuit to the second display portion. The third circuit may be configured to retain the second display data. The fourth circuit may be configured to retain the third display data.

One embodiment of the present invention is a display device including a first circuit, a second circuit, a third circuit, a first display portion, and a second display portion. The first circuit is configured to generate first display data. The first circuit is configured to detect a color region of the first display data and a gray-scale region of the first display data. The first circuit is configured to generate second display data and third display data on the basis of data relating to the color region of the first display data and data relating to the gray-scale region of the first display data. The first circuit is configured to send the second display data to the second circuit. The first circuit is configured to send the third display data to the third circuit. The second circuit is configured to send the second display data received from the first circuit to the first display portion. The third circuit is configured to send the third display data received from the first circuit to the second display portion. The first display portion is configured to display an image corresponding to the second display data. The second display portion is configured to display an image corresponding to the third display data. The first display portion and the second display portion are stacked.

The display device may further include a fourth circuit and a fifth circuit. The second circuit may be configured to write the second display data received from the first circuit to the fourth circuit. The second circuit may be configured to send the second display data read out from the fourth circuit to the first display portion. The third circuit may be configured to write the third display data received from the first circuit to the fifth circuit. The third circuit may be configured to send the third display data read out from the fifth circuit to the second display portion. The fourth circuit may be configured to retain the second display data. The fifth circuit may be configured to retain the third display data.

In addition, the first display portion may include a plurality of first pixels arranged in a matrix. The second display portion may include a plurality of second pixels. The numbers of rows and columns of the second pixels may be the same as the numbers of rows and columns of the first pixels. The first circuit may be configured to divide the first display data into first regions arranged in the same number of rows and the same number of columns as the first pixels and the second pixels. The first circuit may be configured to detect the first region that is a gray-scale region or a color region by raster scanning. The first circuit may be configured to label the first region detected by the raster scanning. The first circuit may be configured to detect another first region that is a gray-scale region or a color region which has different coordinates from the labeled first region by k-neighbor searching centering on the labeled first region (k is an integer). The first circuit may be configured to label the first region detected by the k-neighbor searching.

Furthermore, k may be eight or four.

Moreover, the first circuit may be configured to count the number of the labeled first regions.

In addition, the second display data may include data relating to the color region of the first display data. The third display data may include data relating to the gray-scale region of the first display data.

The display device may further include a sixth circuit. The sixth circuit may be configured to measure the illuminance of external light. The second display data and the third display data may include the data relating to the color region of the first display data when the illuminance of external light is higher than or equal to a first illuminance. Only the second display data may include the data relating to the color region of the first display data when the illuminance of external light is lower than the first illuminance. Only the third display data may include the data relating to the gray-scale region of the first display data when the illuminance of external light is higher than or equal to a second illuminance. The second display data and the third display data may include the data relating to the gray-scale region of the first display data when the illuminance of external light is lower than the second illuminance.

In addition, the first circuit may be configured to convert the color region of the first display data into a gray-scale region and generate the third display data on the basis of the first display data obtained by the conversion.

Furthermore, the first circuit may be configured to convert the color region of the first display data into a gray-scale region by an NTSC weighted average method.

Moreover, the first display portion may include a first display element. The second display portion may include a second display element. The first display element may include a light-emitting layer. The second display element may include a liquid crystal layer.

In addition, the light-emitting layer may be an organic EL layer.

One embodiment is a method for operating a display device, including a first step of generating display data, a second step of dividing the display data into regions arranged in a matrix, a third step of initializing a variable and a counter including a plurality of array variables, a fourth step of detecting the region that is an unlabeled gray-scale region by raster scanning, a fifth step of interrupting the raster scanning when the region that is an unlabeled gray-scale is detected in the fourth step, a sixth step of labeling the region that is an unlabeled gray-scale region and detected in the fourth step, with the variable as a label number, a seventh step of performing increment on the array variables including the variable in an index, an eighth step of performing 8- or 4-neighbor searching centering on the region labeled in the sixth step to detect the region which is an unlabeled gray-scale region, a step of returning to the sixth step when the region that is an unlabeled gray-scale region is detected in the eighth step, a ninth step of performing increment on the variable when the region that is an unlabeled gray-scale region is not detected in the eighth step, a tenth step of resuming the raster scanning from the region in which the raster scanning is interrupted in the fifth step and detecting the region that is an unlabeled gray-scale region, and a step of returning to the sixth step when the region that is an unlabeled gray-scale region is detected in the tenth step.

One embodiment of the present invention is an electronic device including the display device of one embodiment of the present invention and an operation key.

One embodiment of the present invention can provide a display device capable of displaying an image with high brightness and a driving method thereof. One embodiment of the present invention can provide a display device capable of displaying an image with high contrast and a driving method thereof. One embodiment of the present invention can provide a display device capable of displaying a clear image and a driving method thereof. One embodiment of the present invention can provide a display device with low power consumption and a driving method thereof. One embodiment of the present invention can provide a display device with pixels capable of retaining display data for a long time and a driving method thereof. One embodiment of the present invention can provide a display device which can be manufactured through simple process and a driving method thereof. One embodiment of the present invention can provide a novel display device and a driving method thereof.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 5A to 5D are flow charts showing operation of a display device.

FIGS. 16A1, 16A2, 16B1, 16B2, 16C1, and 16C2 are cross-sectional views illustrating transistors.

FIGS. 17A1, 17A2, 17A3, 17B1, and 17B2 are cross-sectional views illustrating transistors.

FIGS. 18A1, 18A2, 18A3, 18B1, 18B2, 18C1, and 18C2 are cross-sectional views illustrating a transistor.

DETAILED DESCRIPTION OF THE INVENTION

Figure 1A:
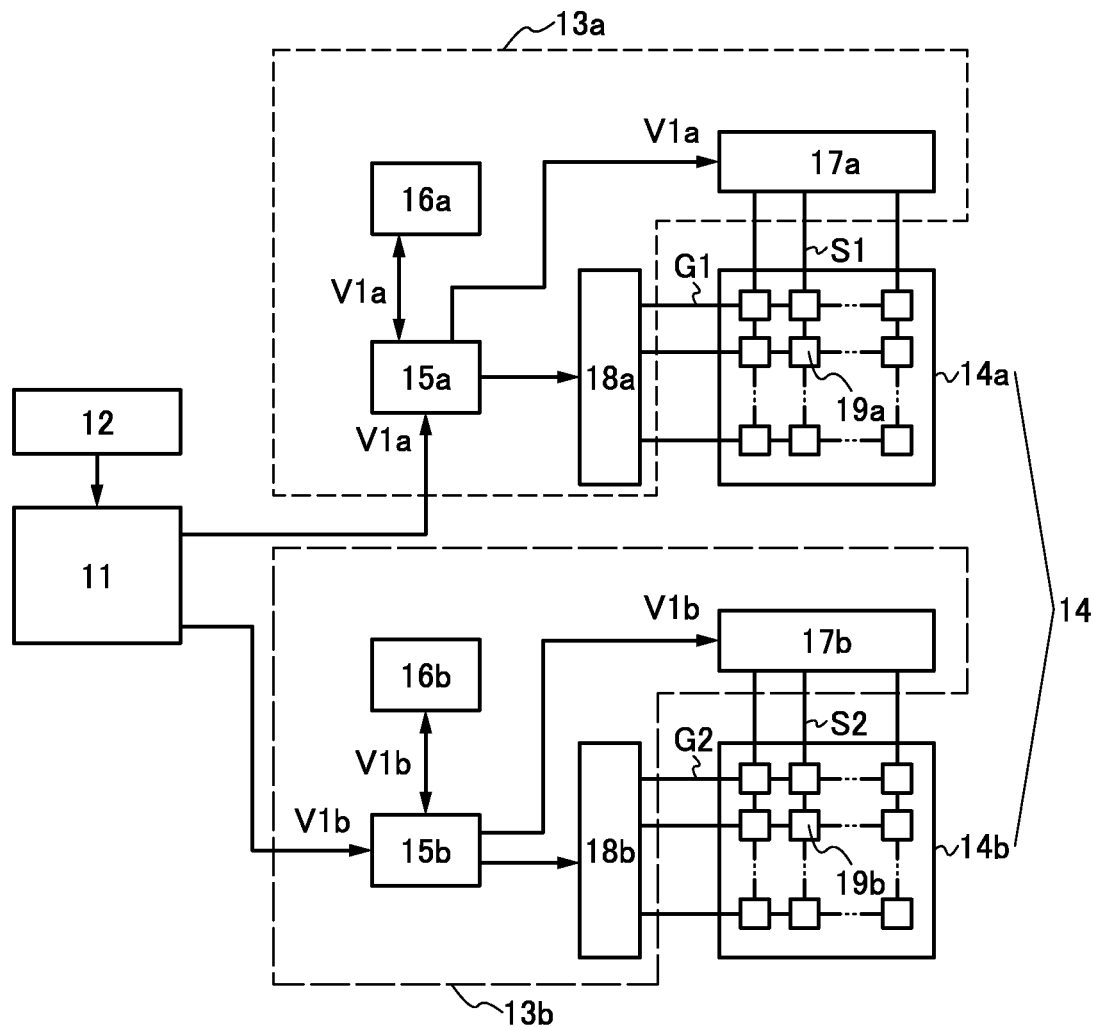
FIGS. 1A to 1D are block diagrams illustrating a display device.

Hereinafter, embodiments of the present invention will be described with reference to the accompanying drawings. Note that the embodiments of the present invention can be implemented with various modes, and it is readily appreciated by those skilled in the art that modes and details can be changed in various ways without departing from the spirit and scope of the present invention. Thus, the present invention should not be interpreted as being limited to the following description of the embodiments.

Although the block diagram attached to this specification and the like shows components classified by their functions in independent blocks, it is difficult to classify actual components according to their functions completely and it is possible for one component to have a plurality of functions.

In this specification and the like, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification and the like, although the connection relationship of the transistor is described assuming that the source and the drain are fixed in some cases for convenience, actually, the names of the source and the drain interchange with each other depending on the relationship of the potentials.

In this specification and the like, the term "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

Note that in this specification and the like, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

Note that "connection" in this specification and the like means electrical connection and corresponds to the state in which current, voltage, or potential can be supplied, applied, or conducted. Accordingly, connection means not only direct connection but also indirect connection through a circuit element such as a wiring, a resistor, a diode, or a transistor so that current, a potential, or voltage can be supplied or transmitted.

In this specification and the like, even when different components are connected to each other in a circuit diagram, there is actually a case where one conductive film has functions of a plurality of components such as a case where part of a wiring serves as an electrode. The term "connection" in this specification and the like also means such a case where one conductive film has functions of a plurality of components.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

(Embodiment 1)

In this embodiment, a configuration example of a display device of one embodiment of the present invention is described with reference to drawings.

One embodiment of the present invention relates to a display device which includes an arithmetic circuit having a function of generating first to third display data, a first display portion, and a second display portion, and relates to a driving method of the display device. The arithmetic circuit has a function of detecting a color region and a gray-scale region of the generated first display data and generating the second display data corresponding to an image to be displayed on the first display portion and the third display data corresponding to an image to be displayed on the second display portion, on the basis of the detection results.

FIG. 1A is a block diagram showing a configuration example of a display device 10 that is the display device of one embodiment of the present invention. The display device 10 includes an arithmetic circuit 11, a photosensor 12, an IC 13a, an IC 13b, a display portion 14a, and a display portion 14b. The IC 13a includes a timing controller 15a, a frame memory 16a, a source driver 17a, and a gate driver 18a. The IC 13b includes a timing controller 15b, a frame memory 16b, a source driver 17b, and a gate driver 18b. A plurality of pixels 19a arranged in a matrix is provided in the display portion 14a, and a plurality of pixels 19b arranged in a matrix is provided in the display portion 14b. Note that in this specification and the like, the display portion 14a and the display portion 14b are collectively referred to as a display portion 14.

The pixels 19a include first display elements, and the pixels 19b include second display elements. As each of the first display elements, for example, an element which includes a light-emitting layer and displays an image by using light emitted from the light-emitting layer can be used. Details thereof will be described later. The luminance and the chromaticity of light emitted from such an element are not affected by external light; therefore an image with a wide color gamut and a high contrast, can be displayed. In short, a clear image can be displayed. Accordingly, in particular, a color image is preferably displayed by the pixels 19a including the first display elements. It is possible to control the luminance of the first display element without being influenced by the illuminance of external light. Therefore, an image is preferably displayed by the pixels 19a including the first display elements under weak external light, in particular. As each of the first display elements, a light-emitting diode (LED), an organic electroluminescence (EL) element, an inorganic EL element, or the like can be used.

For example, light-emitting elements which emit white light are used as the first display elements, and a coloring layer which absorbs light with a certain color is provided in each of the pixels 19a, whereby the display portion 14a including the pixels 19a can display a color image. The details thereof will be described later.

Figure 1B:
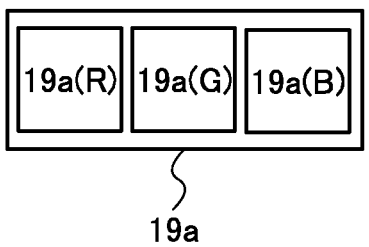

The pixel 19a can have subpixels. For example, as illustrated in FIG. 1B, the pixel 19a can have three types of subpixels: a subpixel 19a(R), a subpixel 19a(G), and a subpixel 19a(B). For example, a light-emitting element which emits white light can be provided in each of the subpixel 19a(R), the subpixel 19a(G), and the subpixel 19a(B); and a coloring layer which transmits red light (with wavelengths greater than or equal to 620 nm and less than or equal to 750 nm), a coloring layer which transmits green light (with wavelengths greater than or equal to 500 nm and less than 570 nm), and a coloring layer which transmits blue light (with wavelengths greater than or equal to 450 nm and less than 500 nm) can be provided in the subpixel 19a(R), the subpixel 19a(G), and the subpixel 19a(B), respectively. Accordingly, for example, the subpixel 19a(R) has a function of emitting red light, the subpixel 19a(G) has a function of emitting green light, and the subpixel 19a(B) has a function of emitting blue light. Note that a subpixel having a function of emitting violet light (with wavelengths greater than or equal to 380 nm and less than 450 nm), yellow light (with wavelengths greater than or equal to 570 nm and less than 590 nm), orange light (with wavelengths greater than or equal to 590 nm and less than 620 nm), or the like may be provided instead of any of the subpixel 19a(R), the subpixel 19a(G), and the subpixel 19a(B) or may be provided in addition to them.

Figure 1C:
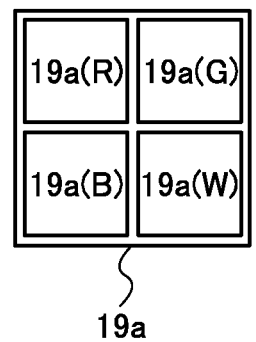

As illustrated in FIG. 1C, the pixel 19a may have a subpixel 19a(W) in addition to the subpixel 19a(R), the subpixel 19a(G), and the subpixel 19a(B). The subpixel 19a(W) may have a structure which includes a light-emitting element emitting white light and does not include a coloring layer. Owing to the structure, the subpixel 19a(W) has a function of emitting white light. Accordingly, the pixel 19a can performed display with high brightness.

Figure 1D:
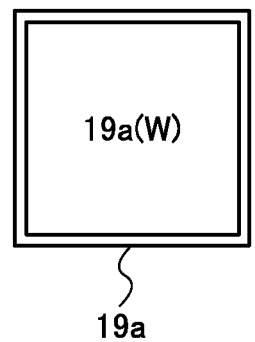

Some of the pixels 19a included in the display portion 14a may have a structure which includes none of the subpixel 19a(R), the subpixel 19a(G), and the subpixel 19a(B), as illustrated in FIG. 1D. That is, some of the pixels 19a included in the display portion 14a may have a function of displaying only a white color. Such a structure enables the display portion 14a to display an image with high brightness.

Note that the pixels 19a in the even-numbered rows in the display portion 14a may have the structure illustrated in FIG. 1D, for example. The pixels 19a in the odd-numbered rows may have the structure illustrated in FIG. 1D, for example. The pixels 19a in the even-numbered columns may have the structure illustrated in FIG. 1D, for example. The pixels 19a in the odd-numbered columns may have the structure illustrated in FIG. 1D, for example. The pixels 19a at intersections between the even-numbered rows and the even-numbered columns may have the structure illustrated in FIG. 1D, for example. The pixels 19a at intersections between the odd-numbered rows and the odd-numbered columns may have the structure illustrated in FIG. 1D, for example. The pixels 19a at intersections between the even-numbered rows and the odd-numbered columns may have the structure illustrated in FIG. 1D, for example. The pixels 19a at intersections between the odd-numbered rows and the even-numbered columns may have the structure illustrated in FIG. 1D, for example. The pixels 19a at intersections between the even-numbered rows and the even-numbered columns and the pixels 19a at the intersections between the odd-numbered rows and the odd-numbered columns may have the structure illustrated in FIG. 1D, for example. The pixels 19a at intersections between the even-numbered rows and the odd-numbered columns and the pixels 19a at intersections between the odd-numbered rows and the even-numbered columns may have the structure illustrated in FIG. 1D, for example.

The pixels 19a in rows that are multiples of a (a is an integer of 2 or more) may have the structure illustrated in FIG. 1D, for example. The pixels 19a in columns that are multiples of b (b is an integer of 2 or more) may have the structure illustrated in FIG. 1D, for example. The pixels 19a at intersections between rows that are multiples of a and columns that are multiples of b may have the structure illustrated in FIG. 1D, for example. The pixels 19a in the (c+a multiple of a)th row may have the structure illustrated in FIG. 1D, for example (c is an integer). The pixels 19a in the (d+a multiple of b)th column may have the structure illustrated in FIG. 1D, for example (d is an integer). The pixels 19a at intersections between the (c+a multiple of a)th row and the (d+a multiple of b)th column may have the structure illustrated in FIG. 1D, for example.

As the second display elements, elements which reflect external light to display an image can be used. Details thereof will be described later. Such elements do not include a light-emitting layer, resulting in significant reduction in power consumption in display. Accordingly, a gray-scale image is particularly preferably displayed by the pixels 19b including the second display elements. In addition, an image is preferably displayed by the pixels 19b including the second display elements under intense external light, in particular. Reflective liquid crystal elements can be used as the second display elements, for example.

The display portion 14b including the pixels 19b does not display an color image but can display only a gray-scale image. For example, the display portion 14b can display only a gray-scale image by not including a coloring layer. The details thereof will be described later. Thus, for example, light emitted from the pixels 19b is not absorbed by a coloring layer; therefore, the pixels 19b can emit light with high luminance to display an image with high brightness and high contrast. Note that the display portion 14b may have a function of displaying a color image by including a coloring layer or the like.

The display device 10 includes a plurality of wirings S1 each of which electrically connects the source driver 17a and the pixels 19a of the same column. The display device 10 includes a plurality of wirings S2 each of which electrically connects the source driver 17b and the pixels 19b of the same column. The display device 10 includes a plurality of wirings G1 each of which electrically connects the gate driver 18a and the pixels 19a of the same column. The display device 10 includes a plurality of wirings G2 each of which electrically connects the gate driver 18b and the pixels 19b of the same column.

The arithmetic circuit 11 is electrically connected to the photosensor 12, the timing controller 15a, and the timing controller 15b. The timing controller 15a is electrically connected to the frame memory 16a, the source driver 17a, and the gate driver 18a. The timing controller 15b is electrically connected to the frame memory 16b, the source driver 17b, and the gate driver 18b.

The arithmetic circuit 11 has a function of generating display data V1a which corresponds to an image to be displayed on the display portion 14a, and display data V1b which corresponds to an image displayed on the display portion 14b. For example, the arithmetic circuit 11 can generate display data V1 and then generate the display data V1a and the display data V1b on the basis of the display data V1. For example, the arithmetic circuit 11 can detects a gray-scale region and a color region in the display data V1, and can generate the display data V1a and the display data V1b on the basis of the detection results. For example, the display data V1a includes data relating to the color region in the display data V1, and the display data V1b includes data relating to the gray-scale region in the display data V1.

In this specification and the like, a gray-scale region refers to, for example, a region in the display data V1 in which the gradation levels of all the colors representing the hue are equal to each other. On the other hand, a color region refers to the region other than the gray-scale region. For example, when the hue is represented by three colors of red, green, and blue, a region in which red, green, and blue have the same gradation levels can be a gray-scale region. A region in which at least one of red, green, and blue has a different gradation level from one or both of the other colors can be a color region.

As the arithmetic circuit 11, for example, a central processing unit (CPU), a digital signal processor (DSP), a graphics processing unit (GPU), or the like can be used. Furthermore, the arithmetic circuit 11 may be obtained with a programmable logic device (PLD) such as a field programmable gate array (FPGA) or a field programmable analog array (FPAA).

The photosensor 12 is a circuit which has a function of measuring the illuminance of external light and outputting an analog signal with a potential corresponding to the illuminance, to the arithmetic circuit 11. Owing to the photosensor 12 included in the display device 10, the arithmetic circuit 11 can generate the display data V1a and the display data V1b on the basis of the illuminance of external light. Details thereof will be described later. Note that the photosensor 12 is not necessarily provided.

The IC 13a is a circuit having a function of operating the pixels 19a and the like included in the display portion 14a. The IC 13b is a circuit having a function of operating the pixels 19b and the like included in the display portion 14b.

The display portion 14a has a function of displaying an image corresponding to the display data V1a. The display portion 14b has a function of displaying an image corresponding to the display data V1b.

The timing controller 15a is a circuit having a function of receiving the display data V1a from the arithmetic circuit 11 and writing the received display data to the frame memory 16a. The timing controller 15a has a function of reading out display data from the frame memory 16a at predetermined timing and sending the display data to the source driver 17a. The timing controller 15a has a function of controlling the operations of the source driver 17a and the gate driver 18a.

The timing controller 15b is a circuit having a function of receiving the display data V1b from the arithmetic circuit 11 and writing the received display data to the frame memory 16b. The timing controller 15b has a function of reading out display data from the frame memory 16b at predetermined timing and sending the display data to the source driver 17b. The timing controller 15b has a function of controlling the operations of the source driver 17b and the gate driver 18b.

Note that the timing at which the timing controller 15a reads out the display data V1a from the frame memory 16a and the timing at which the timing controller 15b reads out the display data V1b from the frame memory 16b can be determined by a clock signal corresponding to a frame frequency, for example. For example, when the frame frequency is 60 Hz, the timing controller 15a can read out the display data V1a from the frame memory 16a 60 times per second, and the timing controller 15b can read out the display data V1b from the frame memory 16b 60 times per second.

The frame memory 16a is a circuit having a function of retaining the display data V1a. The frame memory 16b is a circuit having a function of retaining the display data V1b.

The source driver 17a is a circuit having a function of converting the display data V1a received from the timing controller 15a from digital to analog and sending it to the pixels 19a via the wirings S1. The source driver 17b is a circuit having a function of converting the display data V1b received from the timing controller 15b from digital to analog and sending it to the pixels 19b via the wirings S2.

The gate driver 18a is a circuit having a function of supplying selection signals to the pixels 19a via the wirings G1. The gate driver 18b is a circuit having a function of supplying selection signals to the pixels 19b via the wirings G2.

The pixels 19a have a function of displaying an image corresponding to the display data V1a. The pixels 19b have a function of displaying an image corresponding to the display data V1b.

The display device 10 has two display portions, and it has two ICs accordingly. That is, the display device 10 has two timing controllers, two frame memories, two source drivers, and two gate drivers. Therefore, the display portion 14a and the display portion 14b can be controlled independently of each other, and they can display different images. For example, a color region of an image corresponding to display data generated by the arithmetic circuit 11 can be displayed on the display portion 14a, and a gray-scale region thereof can be displayed on the display portion 14b. Alternatively, for example, a color region can be displayed on both the display portions 14a and 14b, and a gray-scale region can be displayed only by the display portion 14b. Further alternatively, for example, a color region can be displayed only by the display portion 14a, and a gray-scale region can be displayed on both the display portions 14a and 14b.

An image displayed on the display portion 14a and an image displayed on the display portion 14b can be controlled on the basis of, for example, an illuminance measured by the photosensor 12. Details thereof will be described later. The display device 10 may have a function of freely switching an image displayed on the display portion 14a and an image displayed on the display portion 14b regardless of the illuminance of external light.

Figure 2:
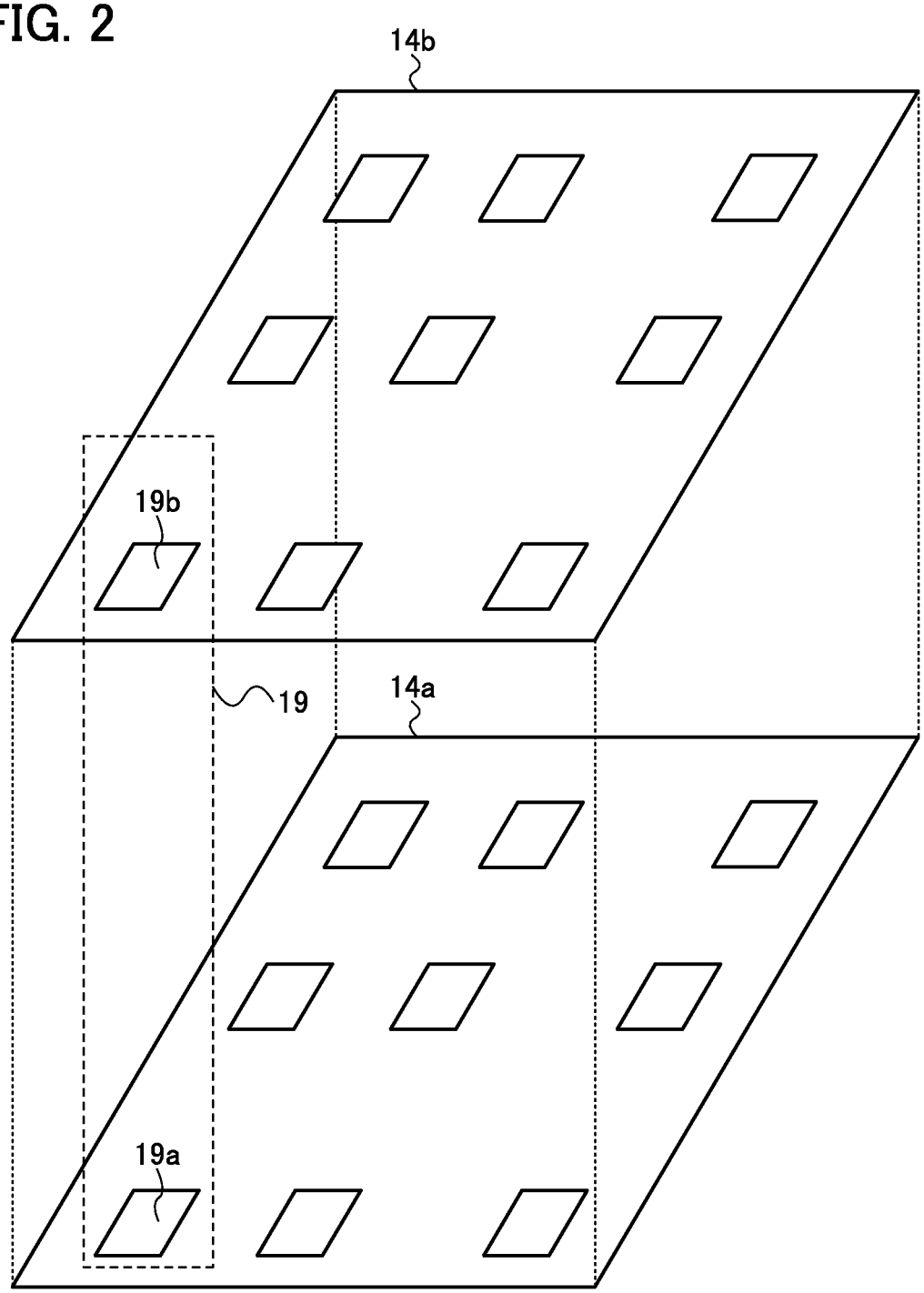
FIG. 2 is a block diagram illustrating a display device.

The display portion 14a and display portion 14b are not stacked in FIG. 1A; however, actually the display portion 14a and the display portion 14b are stacked as illustrated in FIG. 2. Therefore, the pixels 19a and the pixels 19b are stacked. In this specification and the like, each pair of the pixels 19a and 19b stacked as illustrated in FIG. 2 is referred to as a pixel 19. Note that the components except the display portions 14a and 14b and the pixels 19a and 19b are not illustrated in FIG. 2. In addition, although the display portion 14b is provided over the display portion 14a in FIG. 2, the display portion 14b may be provided below the display portion 14a.

Figure 3:
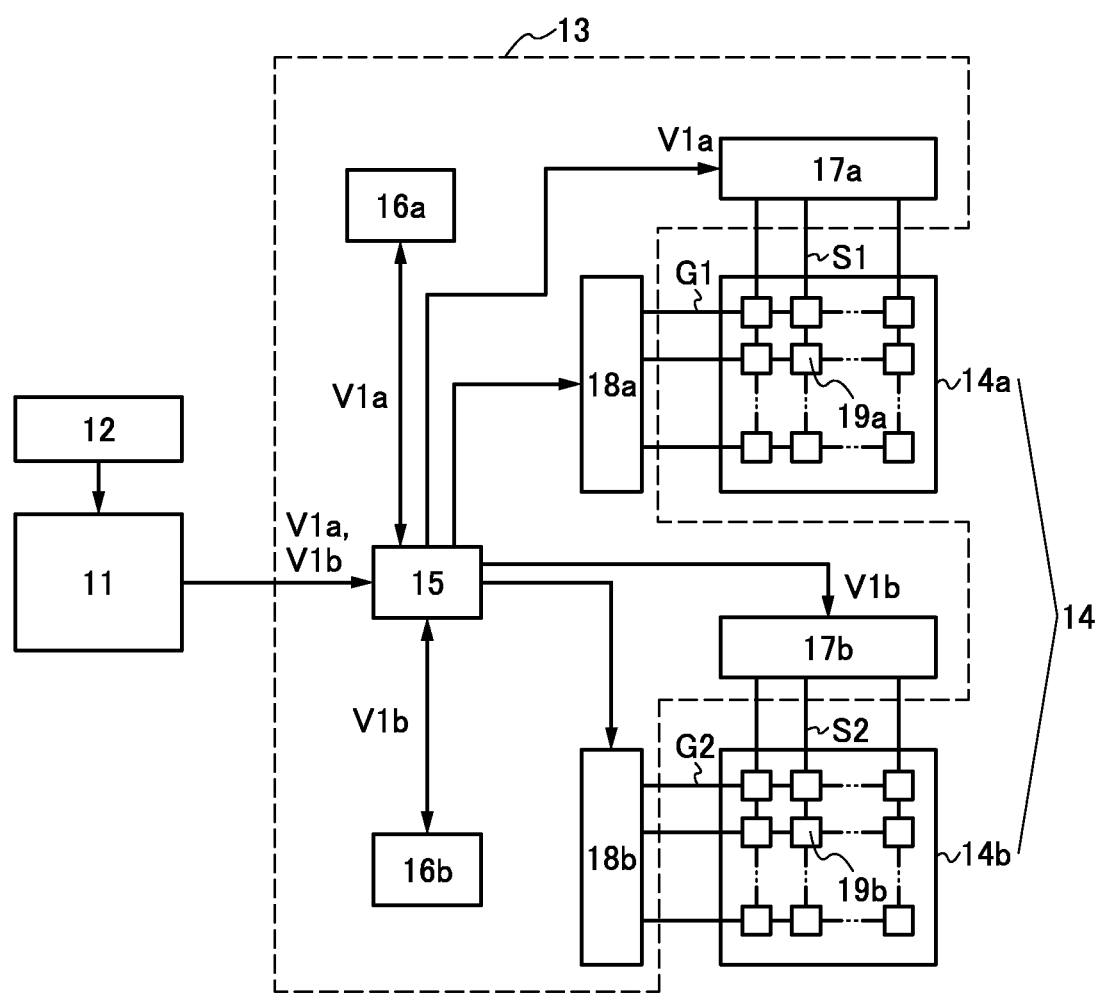
FIG. 3 is a block diagram illustrating a display device.

The display device 10 with the configuration illustrated in FIG. 1A includes the two ICs (the IC 13a and the IC 13b); alternatively, it may include only one IC (an IC 13) as illustrated in FIG. 3. The IC 13 in this configuration includes a timing controller 15, the frame memory 16a, the frame memory 16b, the source driver 17a, the source driver 17b, the gate driver 18a, and the gate driver 18b. That is, the number of timing controllers in this configuration is one. Therefore, an area occupied by the IC can be small, whereby the display device 10 can be reduced in size.

Note that the timing controller 15 is electrically connected to the arithmetic circuit 11, the frame memory 16a, the frame memory 16b, the source driver 17a, the source driver 17b, the gate driver 18a, and the gate driver 18b. In addition, the timing controller 15 has the functions of the timing controllers 15a and 15b included in the display device 10 with the configuration shown in FIG. 1A.

Figure 4A:
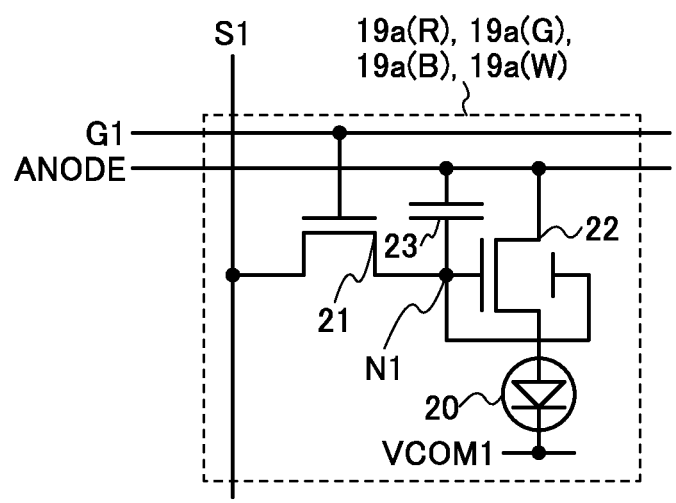
FIGS. 4A and 4B are circuit diagrams each illustrating a pixel circuit.

FIG. 4A is a circuit diagram showing a configuration example of the subpixel included in the pixel 19a, e.g., the subpixel 19a(R), the subpixel 19a(G), the subpixel 19a(B), or the subpixel 19a(W). The subpixel includes a first display element 20, a transistor 21, a transistor 22, a capacitor 23, and the like. As described above, a light-emitting element can be used as the first display element 20. Note that the transistor 21 can be replaced with any element as long as it has a switching function.

A gate of the transistor 21 is electrically connected to the wiring G1, one of a source and a drain of the transistor 21 is electrically connected to the wiring S1, and the other of the source and the drain of the transistor 21 is electrically connected to one electrode of the capacitor 23 and a gate of the transistor 22. The other electrode of the capacitor 23 is electrically connected to a wiring ANODE. One of a source and a drain of the transistor 22 is electrically connected to the wiring ANODE, and the other of the source and the drain of the transistor 22 is electrically connected to one electrode of the first display element 20. The other electrode of the first display element 20 is electrically connected to a wiring VCOM1. A node which is electrically connected to the other of the source and the drain of the transistor 21, the one electrode of the capacitor 23, and the gate of the transistor 22 is referred to as a node N1.

FIG. 4A illustrates an example in which the transistor 22 includes two gates between which a semiconductor is provided and which are electrically connected to each other. This configuration can increase a current flowing through the transistor 22.

A signal for changing the on/off state of the transistor 21 can be supplied as a selection signal to the wiring G1. A signal which corresponds to the display data V1a and controls the conduction state of the transistor 22 can be supplied to the wiring S1. That is, turning on the transistor 21 can make the potential of the node N1 equal to the potential of the wiring S1, which corresponds to the display data V1a. As a result, the display data V1a can be written to the pixel 19a. When the transistor 21 is turned off after the display data V1a is written to the pixel 19a, the potential of the node N1 can be retained. In other words, the display data V1a written to the pixel 19a can be retained.

Potentials having a difference large enough to make the first light-emitting element 20 emit light can be supplied to the wirings VCOM1 and ANODE. A potential difference between the one electrode and the other electrode of the first display element 20 can be controlled by controlling one or both of the potentials of the wirings VCOM1 and ANODE. This allows control of the luminance of the image displayed on the first display element 20.

When the potential difference between the one electrode and the other electrode of the first display element 20 is large, a current flowing through the first display element 20 is large, so that the luminance of the image displayed on the first display element 20 is high. That is, increasing the potential difference between the wiring VCOM1 and the wiring ANODE results in increase in the luminance of the image displayed on the first display element 20. In contrast, reducing the potential difference between the one electrode and the other electrode of the first display element 20 results in reduction in the luminance of the image displayed on the first display element 20. In other words, reducing the potential difference between the wiring VCOM1 and the wiring ANODE results in reduction in the luminance of the image displayed on the first display element 20.

The luminance of the image displayed on the first display element 20 may be controlled by controlling the potential of the wiring S1. Increasing the potential of the wiring S1 results in increase in the current that flows through the first display element 20, so that the luminance of the image displayed on the first display element is increased. In contrast, reducing the potential of the wiring S1 results in reduction in the current that flows through the first display element 20, so that the luminance of the image displayed on the first display element 20 is reduced. In this manner, for example, by adding/subtracting a constant potential to/from the potential corresponding to the display data V1a, the luminance of the image displayed on the first display element 20 can be controlled. Alternatively, for example, by multiplying or dividing the potential corresponding to the display data V1a by a constant, the luminance of the image displayed on the first display element 20 can be controlled.

Note that the potential of the wiring VCOM1, the potential of the wiring ANODE, and the potential of the wiring S1 can be controlled by, for example, the timing controller 15a illustrated in FIG. 1A or the timing controller 15 illustrated in FIG. 3. Alternatively, the potential of the wiring VCOM1 and the potential of the wiring ANODE may be controlled by a circuit not illustrated in FIG. 1A and FIG. 3.

Figure 4B:
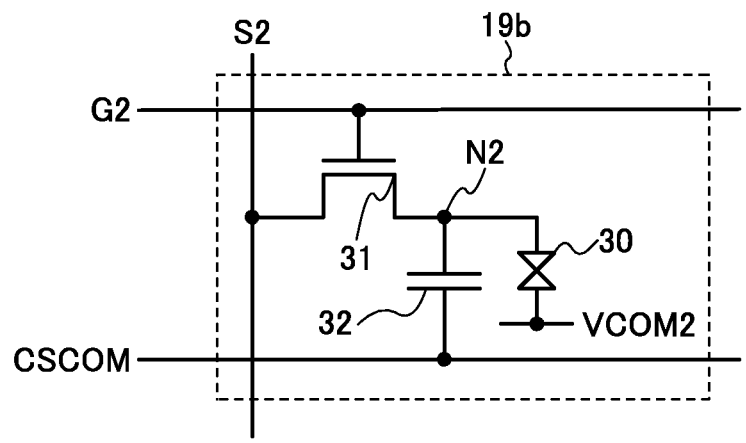

FIG. 4B is a circuit diagram showing a configuration example of the pixel 19b. The pixel 19b includes a second display element 30, a transistor 31, a capacitor 32, and the like. A liquid crystal element can be used as the second display element 30, as described above. The transistor 31 can be replaced with any element other than a transistor as long as it has a switching function.

A gate of the transistor 31 is electrically connected to the wiring G2, one of a source and a drain of the transistor 31 is electrically connected to the wiring S2, and the other of the source and the drain of the transistor 31 is electrically connected to one electrode of the capacitor 32 and one electrode of the second display element 30. The other electrode of the capacitor 32 is electrically connected to a wiring CSCOM. The other electrode of the second display element 30 is electrically connected to a wiring VCOM2. A node which is electrically connected to the other of the source and the drain of the transistor 31, the one electrode of the capacitor 32, and the one electrode of the second display element 30 is referred to as a node N2.

A signal for changing the on/off state of the transistor 31 can be supplied as a selection signal to the wiring G2. A signal which corresponds to the display data V1b and controls the alignment state of liquid crystals included in the second display element 30 can be supplied to the wiring S2. That is, turning on the transistor 31 can make the potential of the node N2 equal to the potential of the wiring S2, which corresponds to the display data V1b. As a result, the display data V1b can be written to the pixel 19b. When the transistor 31 is turned off after the display data V1b is written to the pixel 19b, the potential of the node N2 can be retained. In other words, the display data V1b written to the pixel 19b can be retained.

A predetermined potential can be supplied to the wiring VCOM2 and the wiring CSCOM.

As the transistor 31 included in the pixel 19b, a transistor in which the channel formation region includes an oxide semiconductor (hereinafter, such a transistor is also referred to as an OS transistor) is preferably used. An oxide semiconductor, although details of which will be described later, has a larger energy gap than a semiconductor such as silicon and has low carrier density; therefore, the off-state current of an OS transistor is extremely small. Accordingly, when an OS transistor is used as the transistor 31, the potential of the node N2 can be retained for a long time as compared to the case where a transistor in which the channel formation region includes silicon (such a transistor is also referred to as a Si transistor) is used. Thus, the frequency of refresh operation, which is an operation of rewriting the display data V1b to the pixel 19b, can be reduced, leading to reduced power consumption of the display device 10.

As the transistor 21 included in the pixel 19a, an OS transistor may be used. In that case, the potential of the node N1 can be retained for a long time as compared to the case where a Si transistor is used as the transistor 21. Thus, the frequency of refresh operation, which is an operation of rewriting the display data V1a to the pixel 19a, can be reduced, leading to reduced power consumption of the display device 10.

As the transistor 22 included in the pixel 19a, an OS transistor may be used. When OS transistors are used as the transistor 22, the transistor 21, and the transistor 31, all the transistors that are included in the pixel 19 can be formed in the same layer. Therefore, the manufacturing process of the display device 10 can be simplified.

Next, an example of the operation method of the display device 10 is described using a flow chart shown in FIG. 5A and the like.

First, display data V1 is generated by the arithmetic circuit 11 (Step S01). Here, the display data V1 is original display data of the display data V1a corresponding to an image displayed on the display portion 14a and the display data V1b corresponding to an image displayed on the display portion 14b. Next, the display data V1 is scanned by the arithmetic circuit 11 to detect a color region and a gray-scale region (Step S02). A specific example of the method for detecting the color region and the gray-scale region is described later.

Next, the illuminance of external light is measured by the photosensor 12 (Step S03). The display data V1a and the display data V1b are generated on the basis of the illuminance of external light measured by the photosensor 12.

FIG. 5B is a flow chart for explaining the display portion which displays the color region of the display data V1. As shown in FIG. 5B, whether or not the illuminance of external light measured in Step S03 is higher than or equal to an illuminance E1 is determined (Step S11). When the illuminance of external light measured in Step S03 is higher than or equal to the illuminance E1, the color region is displayed on the display portion 14a and the display portion 14b (Step S12). In other words, the display data V1a and the display data V1b both include data relating to the color region of the display data V1. On the other hand, when the illuminance of external light measured in Step S03 is lower than the illuminance E1, the color region is displayed only by the display portion 14a (Step S13). That is, only the display data V1a includes the data relating to the color region of the display data V1.

When the color region is displayed on the display portion 14a and the display portion 14b, the color region of the display data V1 is preferably converted into a gray-scale region before the display data V1b is generated. For example, after the display data V1a is generated on the basis of the display data V1, it is preferable that the color region of the display data V1 be converted into a gray-scale region, and that the display data V1b be generated on the basis of the display data V1 subjected to conversion into the gray-scale region. Note that the conversion of the display data V1 from the color region into the gray-scale region can be executed by the arithmetic circuit 11, for example.

The gradation levels of the colors representing the hue are different from one another in the color region, whereas the gradation levels of the colors representing the hue are equal to one another in the gray-scale region. Therefore, for example, the gradation levels of the colors are made to be equal to each other by using a predetermined formula, whereby the color region can be converted into a gray-scale region. For example, the display data V1 can be converted into gray-scale display data by a national television system committee (NTSC) weighted average method. With an NTSC weighted average method, a difference in brightness which is sensed by a human owing to a difference in colors, which is called psychophysical quantity, can be taken into consideration when display data is converted into gray-scale display data. For example, in the case where the hue is represented with three colors of red (R), green (G), and blue (B), a gradation level Y of each color after conversion into gray-scale display data can be obtained by performing calculation using, for example, Equation (1) and rounding the resulting value into the nearest whole number. Note that the gradation levels of red, green, and blue before conversion into gray-scale display data are referred to as R, G, and B, respectively.

[Equation 1]

$$Y = 0.298912 \times R + 0.586611 \times G + 0.114478 \times B \quad (1)$$

For example, in the case where the hue is represented by 256 gradations (gradation levels of 0 to 255) of red, 256 gradations (gradation levels of 0 to 255) of green, and 256 gradation (gradation levels of 0 to 255) of blue, when a region with R=200, G=150, and B=100 is converted into a gray-scale region by using Equation (1), the gradation level Y after conversion into the gray-scale region is represented by Equation (2), i.e., R=G=B=159.

[Equation 2]

$$\begin{aligned} Y &= 0.298912 \times 200 + 0.586611 \times 150 + 0.114478 \times 100 Y \\ &= 159.2 \ldots \\ &\approx 159 \end{aligned} \quad (2)$$

Note that although the calculation value of the gradation level Y is rounded to the nearest whole number in Equation (2), the calculation value of the gradation level Y may be truncated or rounded up to the whole number. For example, when the calculation value of the gradation level Y is rounded up to the whole number in Equation (2), the gradation level Y is 160.

The color region may be converted into the gray-scale region without using the NTSC weighted average method.

For example, the color region can be converted into a gray-scale region by Equation (3).

[Equation 3]
$$Y = \frac{R+G+B}{3} \quad (3)$$

Note that in the case where the display portion 14b has a function of performing color display because it has, for example, a coloring layer, when the illuminance of external light is higher than or equal to a predetermined value, the color region may be displayed only by the display portion 14b. The predetermined value is preferably higher than the illuminance E1.

FIG. 5C is a flow chart for explaining a display portion which displays the gray-scale region of the display data V1. Whether or not the illuminance of external light measured in Step S03 is higher than or equal to an illuminance E'1 is determined (Step S21). When the illuminance of external light measured in Step S03 is higher than or equal to the illuminance E'1, the gray-scale region is displayed only by the display portion 14b (Step S22). In other words, only the display data V1b includes data relating to the gray-scale region of the display data V1. When the illuminance of external light measured in Step S03 is lower than the illuminance E'1, the gray-scale region is displayed on the display portion 14a and the display portion 14b (Step S23). That is, both the display data V1a and the display data V1b include the data relating to the gray-scale region of the display data V1.

In the case where the gray-scale region is displayed on the display portion 14a, only the subpixel 19a(W) illustrated in FIG. 1C or 1D may be used for displaying the gray-scale region. This enables the power consumption of the display device 10 to be reduced.

After display is performed by the display portion 14a and the display portion 14b, the operations of Steps S01 to S03 shown in FIG. 5A are performed, and then display is performed by the display portion 14a and the display portion 14b again in accordance with the illuminance of external light, as shown in FIGS. 5B and 5C.

Note that the illuminance E'1 shown in FIG. 5C may be higher than or equal to the illuminance E1 shown in FIG. 5B or may be lower than the illuminance E1. In addition, the illuminances E1 and E'1 can be changed freely.

When the display device 10 is operated by the operation method shown in FIGS. 5A to 5C, the display device 10 can display a clear image even with weak external light. In addition, the power consumption of the display device 10 can be extremely small under strong external light.

Note that in the case where the illuminance of external light is lower than the illuminance E'1 in FIG. 5C, whether or not the illuminance of external light is higher than or equal to an illuminance E'2 may be determined as shown in FIG. 5D (Step S25). Note that the illuminance E'2 is lower than the illuminance E'1. In addition, the illuminance E'2 can be changed freely.

When the illuminance of external light measured in Step S03 is lower than the illuminance E'1 and higher than or equal to the illuminance E'2, the gray-scale region is displayed on the display portion 14a and the display portion 14b (Step S23). That is, both the display data V1a and the display data V1b include the data relating to the gray-scale region of the display data V1. When the illuminance of external light measured in Step S03 is lower than the illuminance E'2, the gray-scale region is displayed only by the display portion 14a (Step S26). That is, only the display data V1a includes data relating to the gray-scale region of the display data V1.

When the display device 10 is operated by the operation method shown in FIG. 5D, the display device 10 can display the gray-scale region with high brightness and high contrast even with weak external light.

The photosensor 12 does not necessarily measure the illuminance of external light. In that case, for example, it is preferable that the color region be displayed only by the display portion 14a and the gray-scale region be displayed only by the display portion 14b. Thus, the color region can be displayed clearly, whereas the gray-scale region can be displayed with lower power consumption. In addition employing a configuration without the photosensor 12 makes it possible to simplify the manufacturing process of the display device 10.

Figure 6:
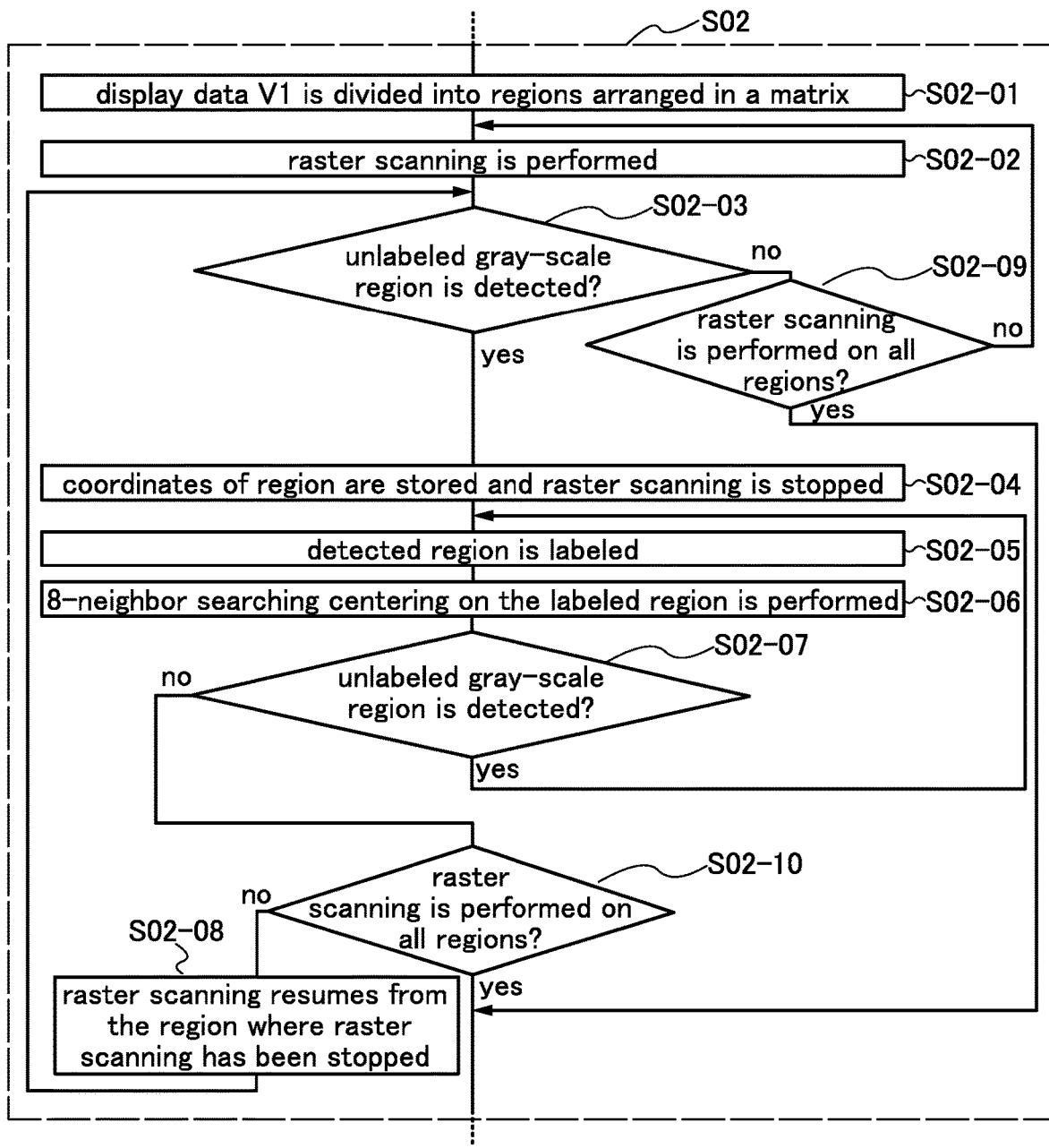
FIG. 6 is a flow chart showing operations of a display device.

Next, a specific operation example of Step S02 shown in FIG. 5A is described. FIG. 6 is a flow chart showing the specific operation example of Step S02 in FIG. 5A. FIGS. 7A to 7H and FIGS. 8A to 8F each illustrate the state of the display data V1 when the arithmetic circuit 11 is operated by the procedure shown in FIG. 6.

Figure 7A:
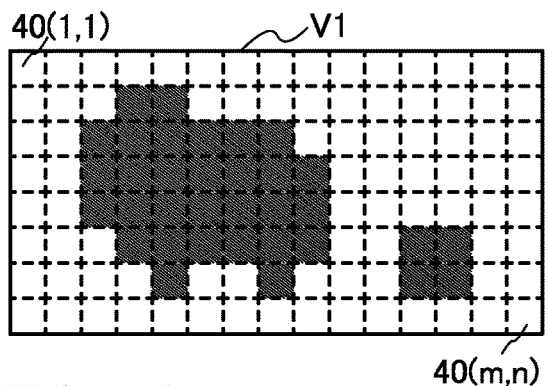
FIGS. 7A to 7H each illustrate the state of display data.
Figure 7B:
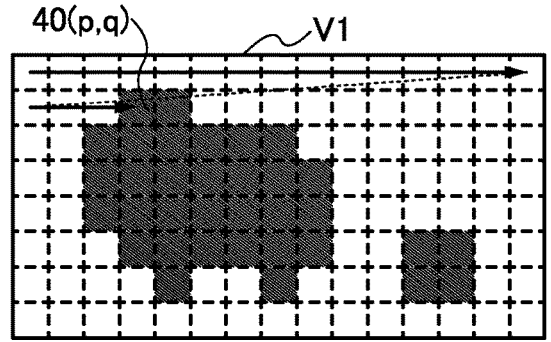

First, as illustrated in FIG. 7A, the display data V1 generated by the arithmetic circuit 11 is divided into regions 40 arranged in a matrix of n rows and m columns, where n and m are natural numbers (Step S02-01). Note that in the display data V1 illustrated in FIG. 7A and the like, the regions 40 with hatching are gray-scale regions and the regions 40 without hatching are color regions.

In this specification and the like, the region 40 in the bth row and ath column (b and a are natural numbers) is referred to as a region 40(a,b). As for the expression of the region 40(a,b), (a,b) may be referred to as the coordinates of the region 40(a,b).

The display data V1 can be divided so as to correspond to the pixels 19 included in the display portion 14. For example, one pixel 19 can correspond to one region 40. For example, when the pixels 19 are arranged in 8000 rows and 4000 columns in the display portion 14, the display data V1 can be divided into regions 40 arranged in 8000 rows and 4000 columns.

Next, raster scanning is performed on the display data V1 that has been divided into the regions 40 arranged in a matrix, so that the regions 40 which are unlabeled gray-scale regions are detected (Step S02-02). The raster scanning mentioned in this specification and the like refers to an operation shown by an arrow in FIG. 7B, in which, for example, whether or not a region 40(1,1) is an unlabeled gray-scale region is determined first; a similar determination is sequentially performed on all the regions 40 of the same row; and then a similar determination is performed on the regions 40 of the next row. Note that labeling refers to an operation of labeling a gray-scale region 40. Detail thereof will be described later.

Whether or not a region 40 is a gray-scale region can be determined on the basis of the gradation levels of the colors representing the hue of the region 40. For example, in the case where the hue of a region 40 is represented by three colors of red, green, and blue, a region 40 whose gradation levels of red (R), green (G), and blue (B) are equal to each other can be a gray-scale region. For example, when the hue of a region 40 is represented by 256 gradations (gradation levels of 0 to 255) of red, 256 gradations (gradation levels of 0 to 255) of green, and 256 gradations (gradation levels of 0 to 255) of blue, a region 40 with R=200, G=200, and B=200 can be a gray-scale region. In contrast, a region 40 with R=200, G=200, and B=100 is not a gray-scale region but a color region.

Note that the region 40 can be a gray-scale region not only in the case where the gradation levels of the colors representing the hue of a region 40 are equal to each other, but also in the case where they are close to each other. For example, when a difference in the gradation level between a color with the highest gradation level and a color with the lowest gradation level of the colors representing the hue of a region 40 is less than or equal to a predetermined value, the region 40 can be a gray-scale region. In the same manner, when the hue of the region 40 is represented by 256 gradations of red, 256 gradations of green, and 256 gradations of blue, and the difference in the gradation level between the color with the highest gradation level and the color with the lowest gradation level of the three colors is less than or equal to 10, the region 40 can be a gray-scale region. In that case, for example, the region 40 with R=200, G=196, and B=192 can be a gray-scale region.

When the region 40 which is an unlabeled gray-scale region is detected (Step S02-03), the coordinates of the region 40 are stored and raster scanning is stopped (Step S02-04). The region 40 where raster scanning is stopped is referred to as a region 40(p,q). Next, the region 40(p,q) is labeled (Step S02-05). Note that the execution order of Step S02-04 and Step S02-05 can be switched.

In the drawings illustrating the display data V1, including FIGS. 7A to 7H and FIGS. 8A to 8F, a region denoted by "R" indicates a labeled region.

Next, an 8-neighbor searching centering on the region 40(p,q) is performed to detect the region 40 which is an unlabeled gray-scale region (Step S02-06). In the 8-neighbor searching, whether or not the regions 40 adjacent to the centered region 40 in the eight directions are unlabeled gray-scale regions is determined in a predetermined order. That is, in the case where the region 40(p,q) serves as the center for 8-neighbor searching, eight regions 40 (regions 40(p−1,q−1), 40(p,q−1), 40(p+1,q−1), 40(p−1,q), 40(p+1,q), 40(p−1,q+1), 40(p,q+1), and 40(p+1,q+1)) are referred to as 8-neighbor regions 40, which are sequentially determined to be or not to be an unlabeled gray-scale region 40. For example, a determination on whether the region 40 is an unlabeled gray-scale region can be sequentially performed in a counterclockwise direction, starting from the region 40 that has been the target region just before whether or not the region 40 serving as the center of 8-neighbor searching is an unlabeled gray-scale region is determined. Alternatively, a determination on whether the region 40 is an unlabeled gray-scale region may be sequentially performed in a counterclockwise direction, starting from the region 40 that has been the target region just before whether or not the region 40 serving as the center of 8-neighbor searching is an unlabeled gray-scale region is determined.

In this specification and the like, a target region indicates a region in which a determination on whether the region is an unlabeled gray-scale region is performed or a region serving as the center of 8-neighbor searching.

Figure 7C:
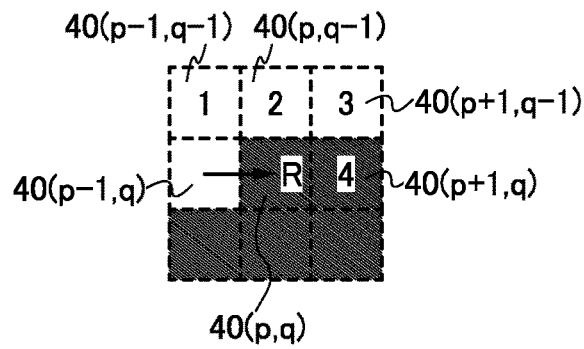

FIG. 7C illustrates 8-neighbor regions 40 centering on the region 40(p,q) that has just been labeled. Note that numbers described in FIG. 7C represent the order of the determination on whether or not the region 40 is an unlabeled gray-scale region in 8-neighbor searching. Note that numbers are sometimes described in other drawings in order to show an example of a determination order or the like.

Just before whether or not the region 40(p,q) is an unlabeled gray-scale region is determined, a similar determination has been performed on the region 40(p−1,q). That is, just before whether or not the region 40(p,q) is an unlabeled gray-scale region is determined, the region 40(p−1,q) has been a target region. Therefore, for example, a determination can be performed sequentially in a clockwise direction, starting from the region 40(p−1,q). In other words, for example, as illustrated in FIG. 7C, the region 40(p−1,q−1) can be a starting point of 8-neighbor searching, the determination can be performed on the region 40(p,q−1), the region 40(p+1,q−1), and the region 40(p+1,q) in this order. Although it is not preferable that the region 40(p−1,q) that has been the target region just before whether or not the region 40(p,q) is an unlabeled gray-scale region is determined be a starting point of 8-neighbor searching, it may be a starting point of 8-neighbor searching.

Figure 7D:
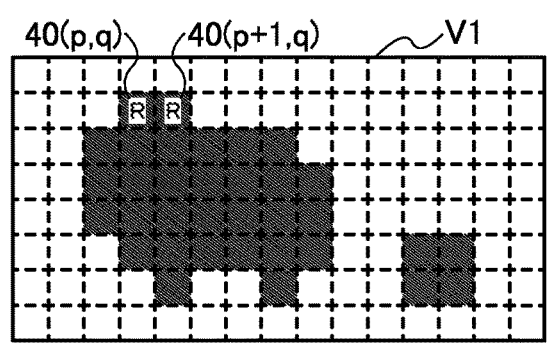

When a region 40 which is an unlabeled gray-scale region is detected in the 8-neighbor searching, the region 40 is labeled as shown in Step S02-05 to terminate the 8-neighbor searching. As illustrated in FIG. 7C, the region 40(p−1,q−1), the region 40(p,q−1), and the region 40(p+1,q−1) are not gray-scale regions, and the region 40(p+1,q) that is to be subjected to the determination next to the region 40(p+1,q−1) is an unlabeled gray-scale region. Thus, the region 40(p+1,q) is labeled to terminate the 8-neighbor searching centering on the region 40(p,q). FIG. 7D illustrates a state of the display data V1 after the region 40(p+1,q) is labeled.

Figure 7E:
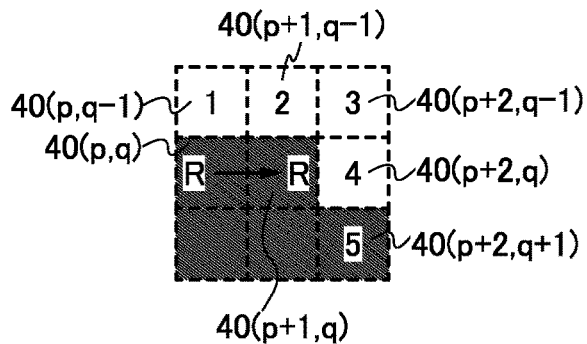

Next, 8-neighbor searching centering on the region 40(p+1,q) that has been labeled in Step S02-05 is performed as shown in Step S02-06, so that a region 40 which is an unlabeled gray-scale region is detected. FIG. 7E illustrates 8-neighbor regions 40 centering on the region 40(p+1,q) in the state of FIG. 7D.

Just before whether or not the region 40(p+1,q) is an unlabeled gray-scale region is determined, the region 40(p,q) has been a region serving as the center of 8-neighbor searching. That is, just before whether or not the region 40(p+1,q) is an unlabeled gray-scale region is determined, the region 40(p,q) has been a target region. Therefore, for example, a determination can be performed sequentially in a clockwise direction, starting from the region 40(p,q). In other words, for example, as illustrated in FIG. 7E, the region 40(p,q−1) can be a starting point of 8-neighbor searching, the determination can be performed on the region 40(p+1,q−1), a region 40(p+2,q−1), a region 40(p+2,q), and a region 40(p+2,q+1) in this order.

Figure 7F:
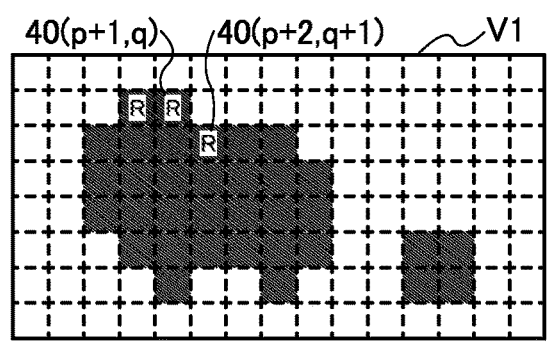

As illustrated in FIG. 7E, the region 40(p,q−1), the region 40(p+1,q−1), the region 40(p+2,q−1), and the region 40(p+2,q) are not gray-scale regions, and the region 40(p+2,q+1) that is to be subjected to the determination next to the region 40(p+2,q) is an unlabeled gray-scale region. Thus, the region 40(p+2,q+1) is labeled as shown in Step S02-05 to terminate the 8-neighbor searching centering on the region 40(p+1,q). FIG. 7F illustrates a state of the display data V1 after the region 40(p+2,q+1) is labeled.

Figure 7G:
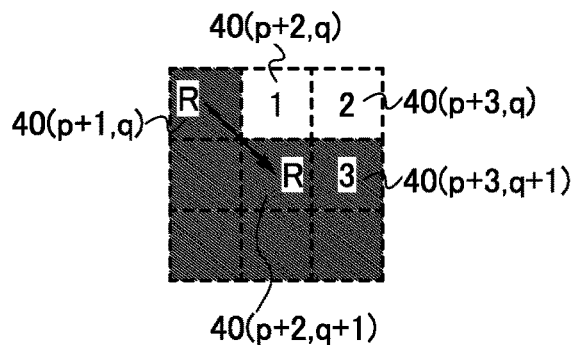

Next, 8-neighbor searching centering on the region 40(p+1,q+1) that has been labeled in Step S02-05 is performed as shown in Step S02-06, so that a region 40 which is an unlabeled gray-scale region is detected. FIG. 7G illustrates 8-neighbor regions 40 centering on the region 40(p+1,q+1) in the state of FIG. 7F.

Just before whether or not the region 40(p+1,q+1) is an unlabeled gray-scale region is determined, the region 40(p+1,q) has been a region serving as the center of 8-neighbor searching. That is, just before whether or not the region 40(p+1,q+1) is an unlabeled gray-scale region is determined, the region 40(p+1,q) has been a target region. Therefore, for example, a determination can be performed sequentially in a clockwise direction, starting from the region 40(p+1,q). In other words, for example, as illustrated in FIG. 7G, the region 40(p+2,q) can be a starting point of 8-neighbor searching, the determination can be performed on a region 40(p+3,q) and a region 40(p+3,q+1) in this order.

Figure 7H:
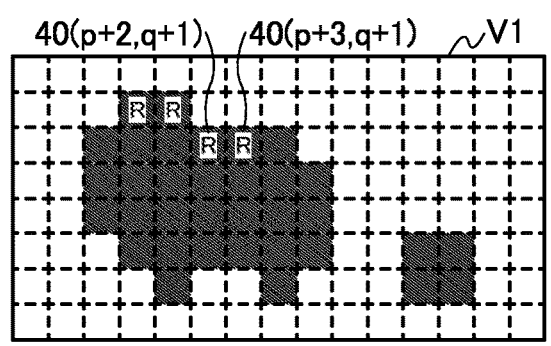

As illustrated in FIG. 7G, the region 40(p+2,q) and the region 40(p+3,q) are not gray-scale regions, and the region 40(p+3,q+1) that is to be subjected to the determination next to the region 40(p+3,q) is an unlabeled gray-scale region. Thus, the region 40(p+3,q+1) is labeled as shown in Step S02-05 to terminate the 8-neighbor searching centering on the region 40(p+2,q+1). FIG. 7H illustrates a state of the display data V1 after the region 40(p+3,q+1) is labeled.

Figure 8A:
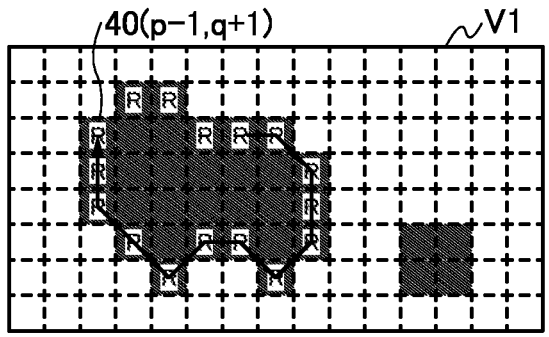
FIGS. 8A to 8F each illustrate the state of display data.

The regions 40 which are gray-scale regions are labeled by repeating Step S02-05 and Step S02-06. FIG. 8A illustrates a state of the display data V1 just after the region 40(p-1,q+1) is labeled. In FIG. 8A, the arrow indicates the order of labeling.

In the state of FIG. 8A, 8-neighbor searching centering on the region 40(p-1,q+1) is performed as shown in Step S02-06, whereby the region 40 which is an unlabeled gray-scale region is detected. FIG. 8B illustrates 8-neighbor regions 40 centering on the region 40(p-1,q+1) in the state of FIG. 8A.

Just before whether or not the region 40(p-1,q+1) is an unlabeled gray-scale region is determined, a region 40(p-1,q+2) has been a region serving as the center of 8-neighbor searching. That is, just before whether or not the region 40(p-1,q+1) is an unlabeled gray-scale region is determined, the region 40(p-1,q+2) has been a target region. Therefore, for example, a determination can be performed sequentially in a clockwise direction, starting from the region 40(p-1,q+2). In other words, for example, as illustrated in FIG. 8B, a region 40(p-2,q+2) can be a starting point of 8-neighbor searching, the determination can be performed on a region 40(p-2,q+1), a region 40(p-2,q), the region 40(p-1,q), the region 40 (p,q), and the region 40(p,q+1) in this order.

Figure 8B:
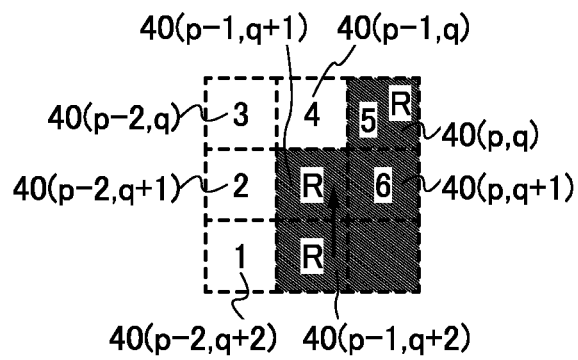
Figure 8C:
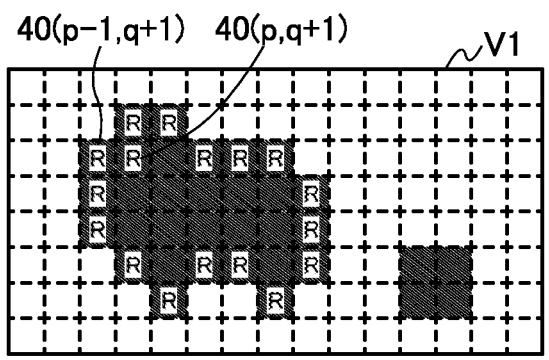

As illustrated in FIG. 8B, the region 40(p-2,q+2), the region 40(p-2,q+1), the region 40(p-2,q), and the region 40(p-1,q) are not gray-scale regions. In addition, the region 40(p,q) is a gray-scale region but has been already labeled. Meanwhile, the region 40(p,q+1), which is to be subjected to the determination next to the region 40(p,q), is an unlabeled gray-scale region. Thus, the region 40(p,q+1) is labeled in a manner shown in Step S02-05 to terminate the 8-neighbor searching centering on the region 40(p-1,q+1). FIG. 8C illustrates a state of the display data V1 after the region (p,q+1) is labeled.

Figure 8D:
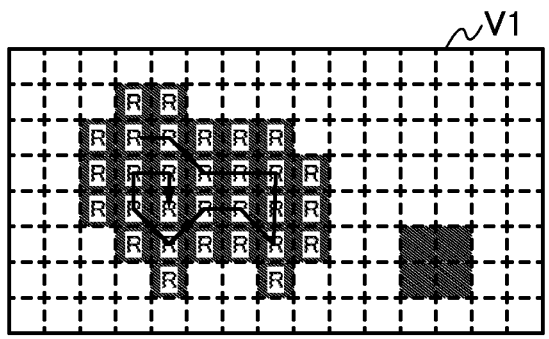
Figure 8E:
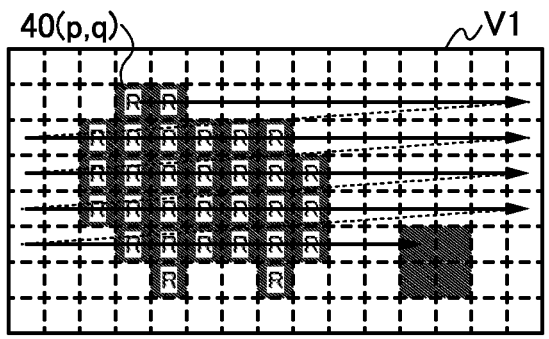

The regions 40 which are gray-scale regions are labeled by repeating Step S02-05 and Step S02-06. When the display data V1 gets into a state shown in FIG. 8D, even if 8-neighbor searching centering on the region 40 that has been labeled latest is performed, an unlabeled gray-scale region is not detected (Step S02-07). In FIG. 8D, the arrow indicates the order of labeling. In that case, raster scanning resumes from the region where raster scanning has been stopped in Step S02-04 (Step S02-08). In other words, raster scanning resumes from the region 40(p,q) as denoted by an arrow in FIG. 8E. Thus, the region 40 which is an unlabeled gray-scale region is detected. After the region 40 is detected, operations of Steps S02-04 to S02-06 are performed. When the region 40 which is an unlabeled gray-scale region is not detected by 8-neighbor searching, raster scanning resumes from the region where raster scanning has been stopped, as shown in Step S02-08.

Figure 8F:
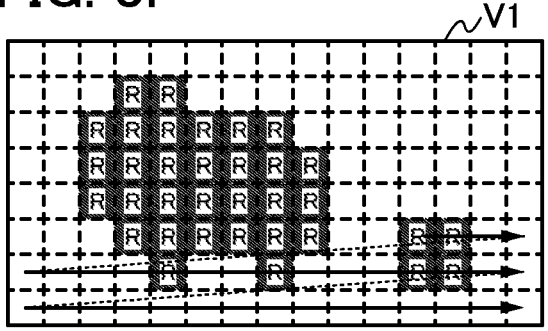

After raster scanning is performed on all the regions 40 by the above operations as illustrated in FIG. 8F, Step S02 is terminated (Step S02-09 and Step S02-10). Thus, the labeled regions 40 can be determined as gray-scale regions, and the unlabeled regions 40 can be determined as color regions.

Figure 9:
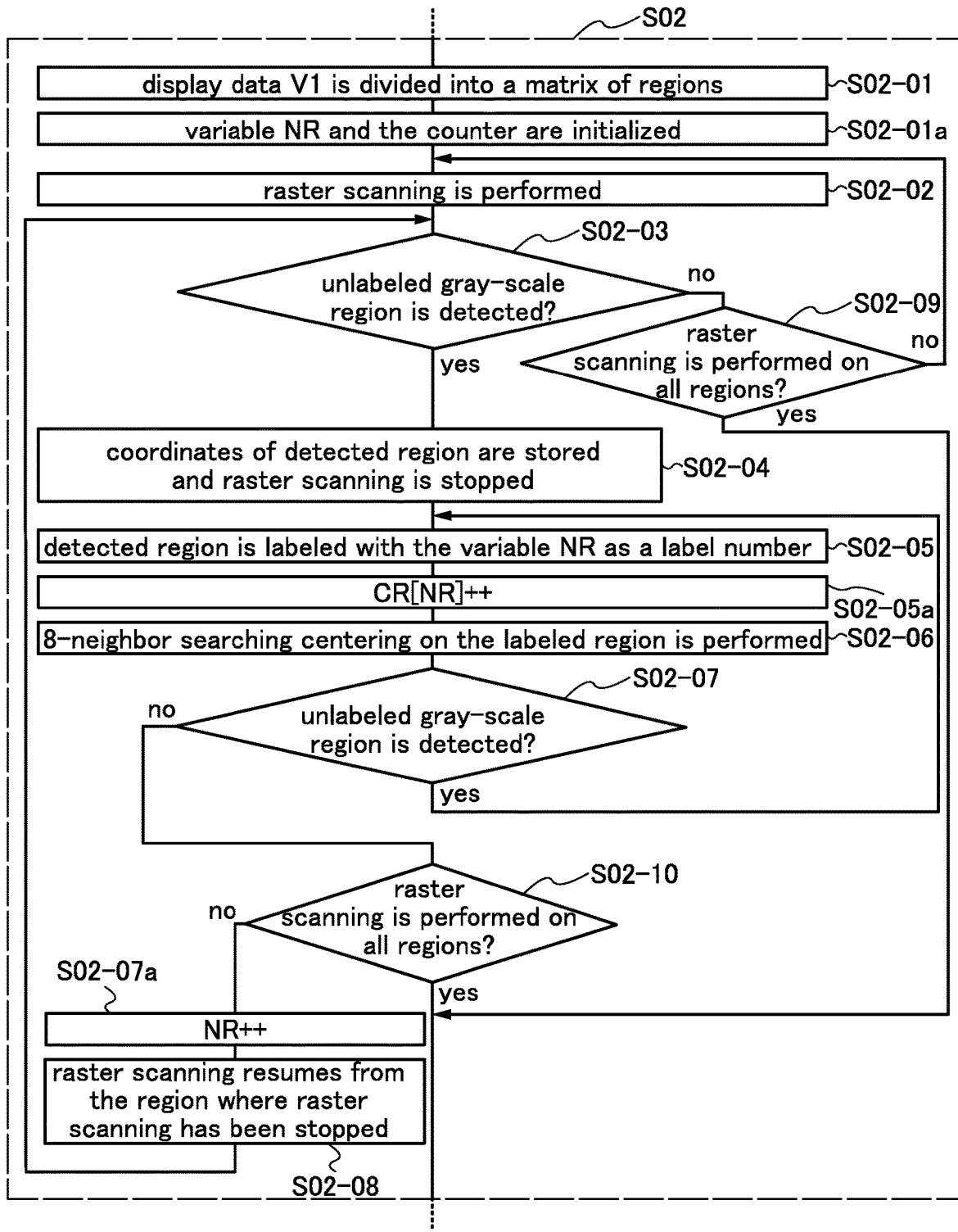
FIG. 9 is a flow chart showing operations of a display device.

The arithmetic circuit 11 may have a function of counting the number of the regions 40 which are labeled during a period from the stop to the resumption of raster scanning. FIG. 9 is a flow chart showing specific operations of Step S02 shown in FIG. 5A in the case where the number of the regions 40 that are labeled during the period from the stop to the resumption of raster scanning is counted. In the operations shown in FIG. 9, a variable NR and a counter are used. Note that the counter can have an array consisting of array variables CR[0] to CR[t] (t is a natural number).

As shown in FIG. 9, the display data V1 is divided into a matrix of regions 40 in Step S02-01, and then the variable NR and the counter are initialized (Step S02-01a). Here, initialization of the variable NR indicates that the value of the variable NR is set to 0, for example. In addition, initialization of the counter indicates that all the values of the array variables CR[0] to CR[t] are set to 0, for example.

When the region 40 which is an unlabeled gray-scale region is detected, the region 40 is labeled with the variable NR as a label number in Step S02-05. After that, for example, the array valuable [NR] is incremented, so that the number of the regions 40 that are labeled with the variable NR as the label number is counted (Step S02-05a). Note that in FIG. 9, "CR[NR]++" represents increment of the array variable CR[NR]. Increment indicates that one is added to the value of a variable.

In the case where the region 40 which is an unlabeled gray-scale region is not detected by 8-neighbor searching, increment of the variable NR is performed (Step S02-07a), and then, as shown in Step S02-08, raster scanning resumes from the region where raster scanning has been stopped. Note that "NR++" in FIG. 9 represents increment of the variable NR. The above-described steps are different points of the operation shown in FIG. 9 from the operation shown in FIG. 6.

Figure 10:
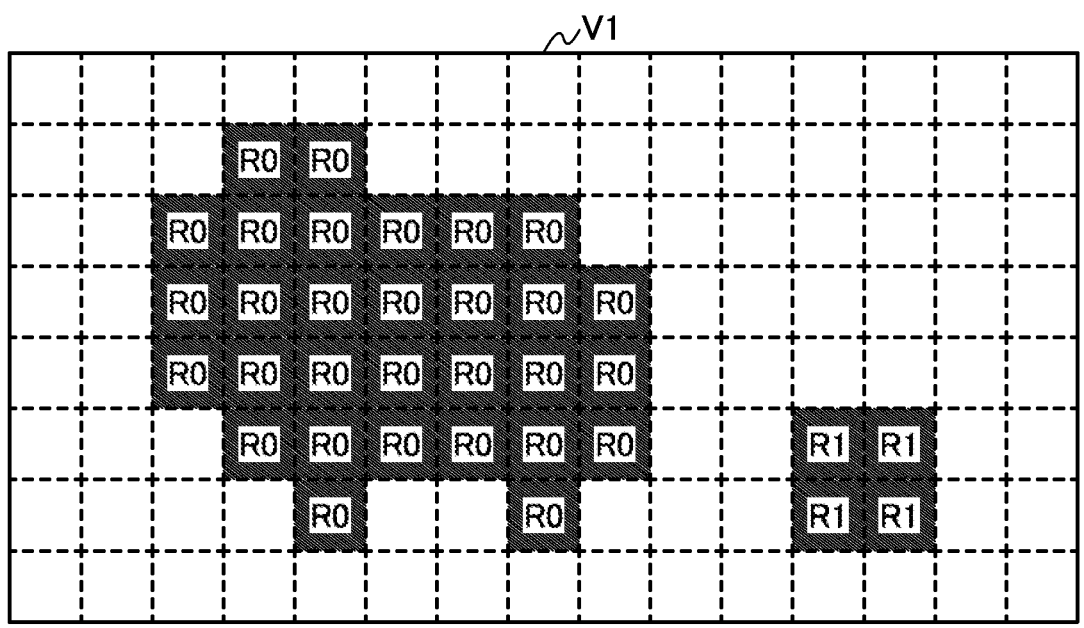
FIG. 10 illustrates the state of display data.

FIG. 10 illustrates an example of a state of the display data V1 after Step S02 in FIG. 5A is performed by following the procedure shown in FIG. 9. In FIG. 10, a region with "R0" is a region labeled with a label number 0, and a region with "R1" is a region labeled with a label number 1. Labeling is performed in the procedure shown in FIG. 9, whereby the number of the regions 40 included in a group of gray-scale regions shown in FIG. 10 can be calculated from the value of the array variable of the counter. Thus, the group of gray-scale regions where the number of regions 40 is smaller than a predetermined value can be treated like a color region. That is, gray-scale regions occupying an area smaller than or equal to a predetermined value can be treated like a color region. In that case, for example, when the display data V1, the display data V1a, and display data V1b are compressed, the compression rate can be increased and the capacity can be reduced.

Figure 11:
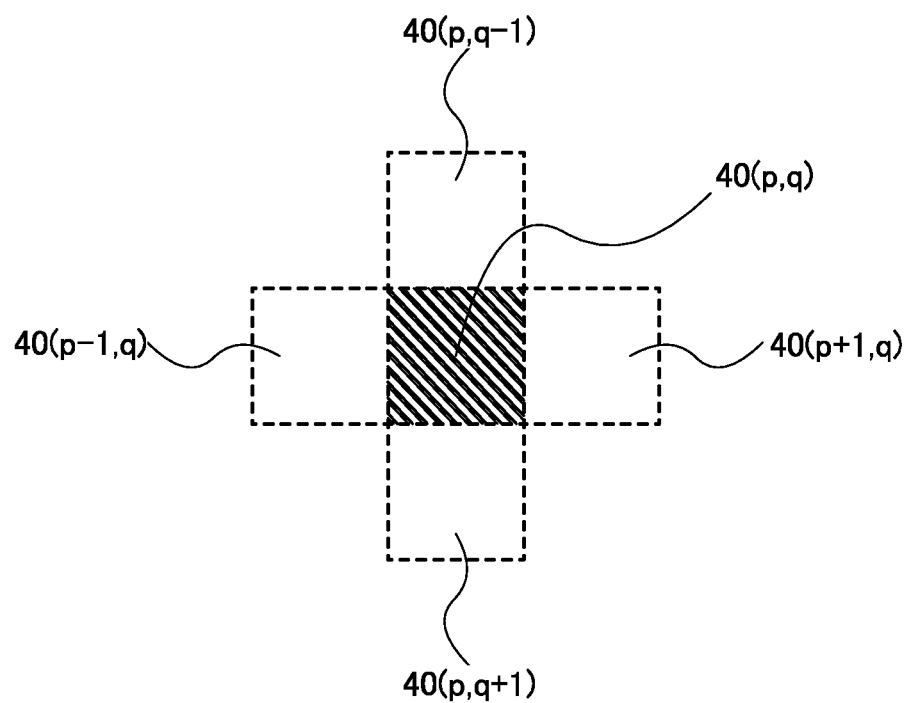
FIG. 11 illustrates 4-neighbor searching.

Although the region 40 which is an unlabeled gray-scale region is detected by 8-neighbor searching in FIG. 6, FIGS. 7A to 7H, FIGS. 8A to 8F, and FIG. 9, one embodiment of the present invention is not limited thereto, and the region 40 which is an unlabeled gray-scale region can be detected by k-neighbor searching (k is an integer). For example, the region 40 which is an unlabeled gray-scale region can be detected by 4-neighbor searching. FIG. 11 illustrates 4-neighbor regions 40 centering on the region 40(p,q). The centered region 40 is hatched in FIG. 11.

As illustrated in FIG. 11, the left, right, top, and bottom regions 40 adjacent to the centered region 40 are the 4-neighbor regions 40. That is, the regions 40(p−1,q), the region 40(p,q−1), the region 40(p+1,q), and the region 40(p,q+1) are the 4-neighbor regions 40. For example, when a determination on whether or the region 40 is an unlabeled gray-scale region is sequentially performed in a clockwise direction, starting from the region 40(p,q−1), the determination can be performed on the region 40(p,q−1), the region 40(p+1,q), the region 40(p,q+1), and the region 40(p−1,q) in this order.

Although FIG. 6, FIGS. 7A to 7H, FIGS. 8A to 8F, FIG. 9, and FIG. 10 illustrate the operation in which the gray-scale regions 40 are labeled and the color regions 40 are not labeled, the operation may be such that the color regions 40 are labeled and the gray-scale regions are not labeled. Also in that case, FIG. 6, FIGS. 7A to 7H, FIGS. 8A to 8F, FIG. 9, and FIG. 10 can be referred to for the specific operation of Step S02 shown in FIGS. 5A to 5D if the term "gray-scale" is replaced with the term "color" or the like.

Figure 12A:
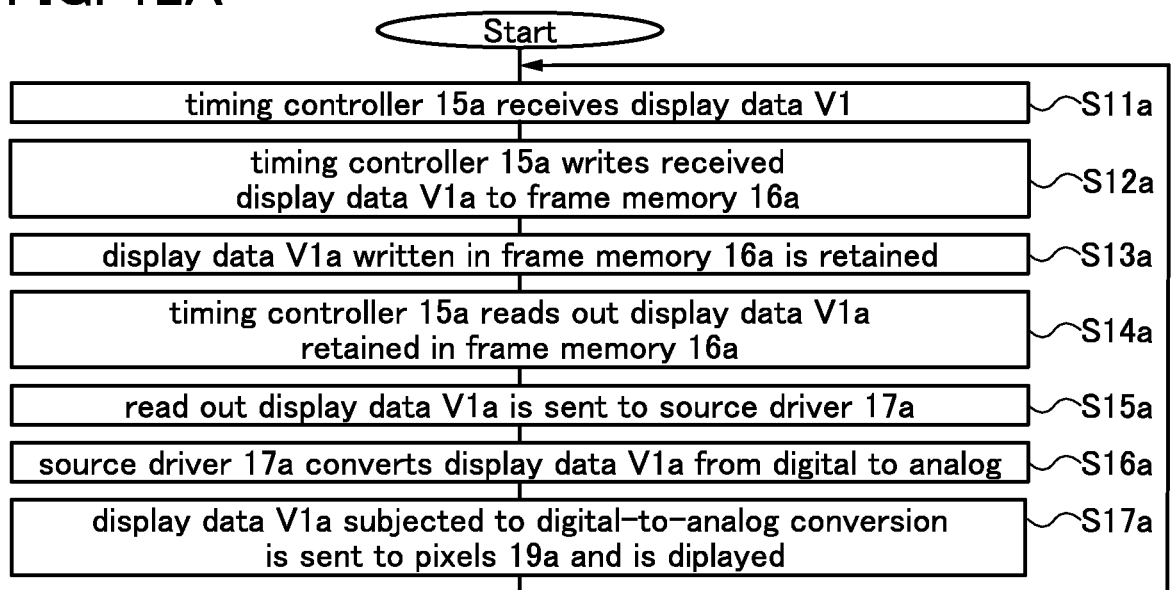
FIGS. 12A and 12B are flow charts illustrate operations of a display device.
Figure 12B:
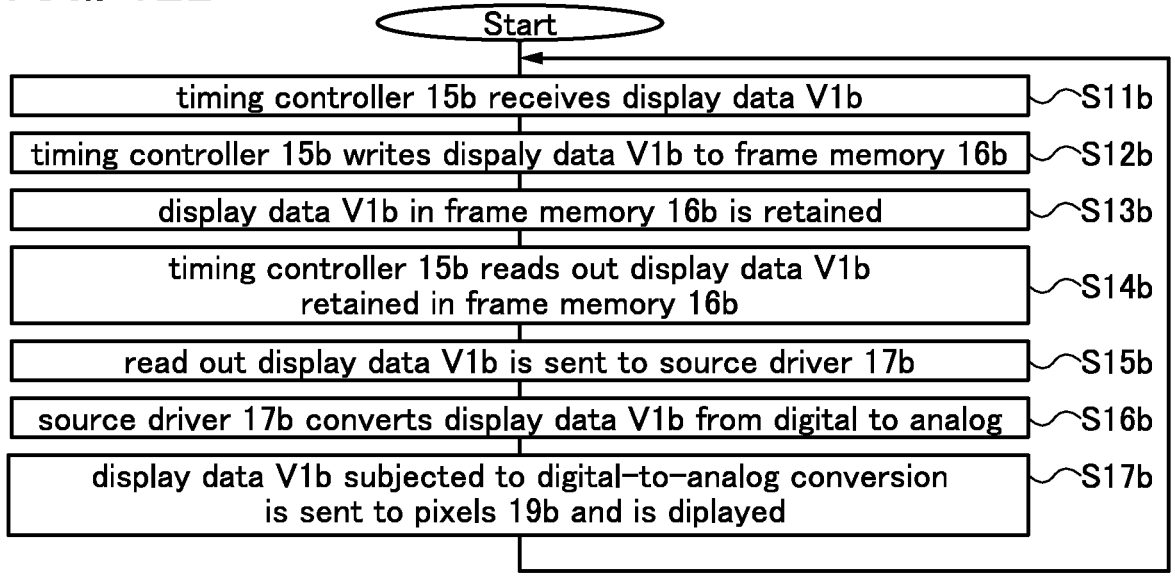

FIG. 12A is a flow chart showing an operation example of the IC 13a with the configuration shown in FIG. 1A, and FIG. 12B is a flow chart showing an operation example of the IC 13b with the configuration shown in FIG. 1A.

The operation example of the IC 13a is described. As shown in FIG. 12A, first, the timing controller 15a receives the display data V1a from the arithmetic circuit 11 (Step S11a). Next, the timing controller 15a writes the received display data V1a to the frame memory 16a (Step S12a). The display data V1a written in the frame memory 16a is retained (Step S13a), and the timing controller 15a reads out the display data V1a retained in the frame memory 16a at a predetermined timing (Step S14a). The timing at which the timing controller 15a reads out the display data V1a retained in the frame memory 16a can be determined by a clock signal corresponding to, for example, the frame frequency, as described above.

The timing controller 15a sends the display data V1a, which has been read out from the frame memory 16a, to the source driver 17a (Step S15a). Then, the source driver 17a converts the display data V1a from digital to analog (Step S16a). The source driver 17a sends the display data V1a, which has been subjected to digital-to-analog conversion, to the pixels 19a, so that an image corresponding to the display data V1a is displayed on the display portion 14a (Step S17a). After that, the process returns to Step S11a, and the timing controller 15a receives the display data V1a from the arithmetic circuit 11. This is the operation example of the IC 13a.

The IC 13b can be operated in a procedure similar to that of the IC 13a as shown in FIG. 12B. Steps S11b to S17b shown in FIG. 12B correspond to Steps S11a to S17a shown in FIG. 12A, respectively.

At least part of this embodiment can be implemented in combination with any of the other embodiments described in this specification as appropriate.

(Embodiment 2)

In this embodiment, the structure of a display panel of one embodiment of the present invention is described with reference to the drawings.

Figure 13:
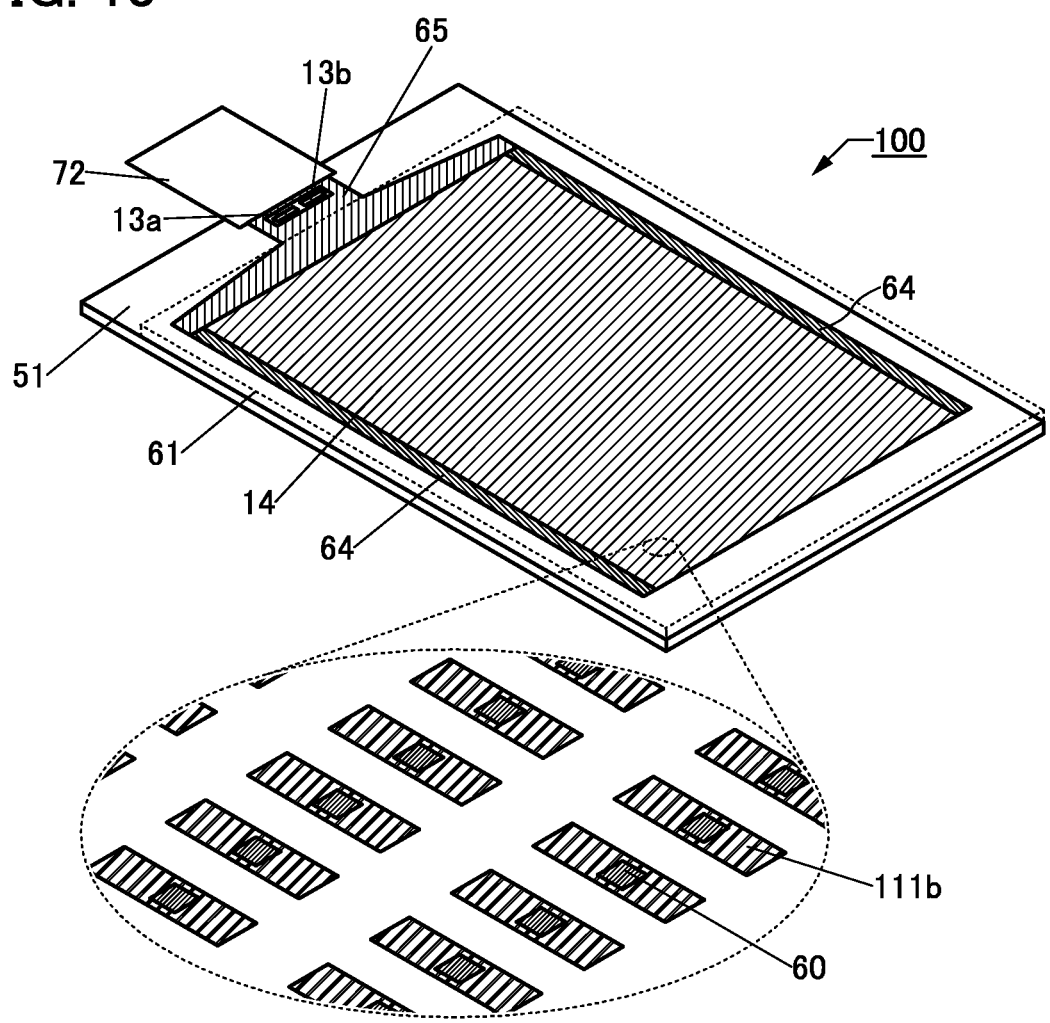
FIG. 13 is a perspective view illustrating a display device.

FIG. 13 is a schematic perspective view illustrating a display panel 100 of one embodiment of the present invention. In the display panel 100, a substrate 51 and a substrate 61 are attached to each other. In FIG. 13, the substrate 61 is denoted by a dashed line.

The display panel 100 includes the display portion 14, a circuit 64, a wiring 65, and the like. The substrate 51 is provided with the circuit 64, the wiring 65, conductive layers 111b which function as pixel electrodes, and the like. In FIG. 13, the IC 13a, the IC 13b, and an FPC 72 are mounted on the substrate 51. Thus, the structure illustrated in FIG. 13 can be referred to as a display module including the display panel 100, the FPC 72, the IC 13a, and the IC 13b.

Although FIG. 13 illustrates the structure that includes the ICs 13a and 13b shown in FIGS. 1A to 1D, the IC 13 shown in FIG. 3 may be provided instead of the ICs 13a and 13b.

A circuit functioning as a gate driver can be used as the circuit 64, for example.

The wiring 65 has a function of supplying a signal or electric power to the display portion or the circuit 64. The signal or electric power is input to the wiring 65 from the outside through the FPC 72 or from the IC 13a and the IC 13b.

FIG. 13 shows an example in which the IC 13a and the IC 13b are provided on the substrate 51 by a chip on glass (COG) method or the like. Note that the IC 13a and the IC 13b may be mounted on the FPC 72 by a chip on film (COF) method or the like.

FIG. 13 also shows an enlarged view of part of the display portion 14. The conductive layers 111b included in a plurality of display elements are arranged in a matrix in the display portion 14. The conductive layers 111b each have a function of reflecting visible light and serve as a reflective electrode of the second display element 30 described later.

As illustrated in FIG. 13, the conductive layer 111b has an opening. In addition, the first display element 20 functioning as a light-emitting element is provided to be closer to the substrate 51 than the conductive layer 111b is. Light is emitted from the first display element 20 to the substrate 61 side through the opening in the conductive layer 111b.

Figure 14:
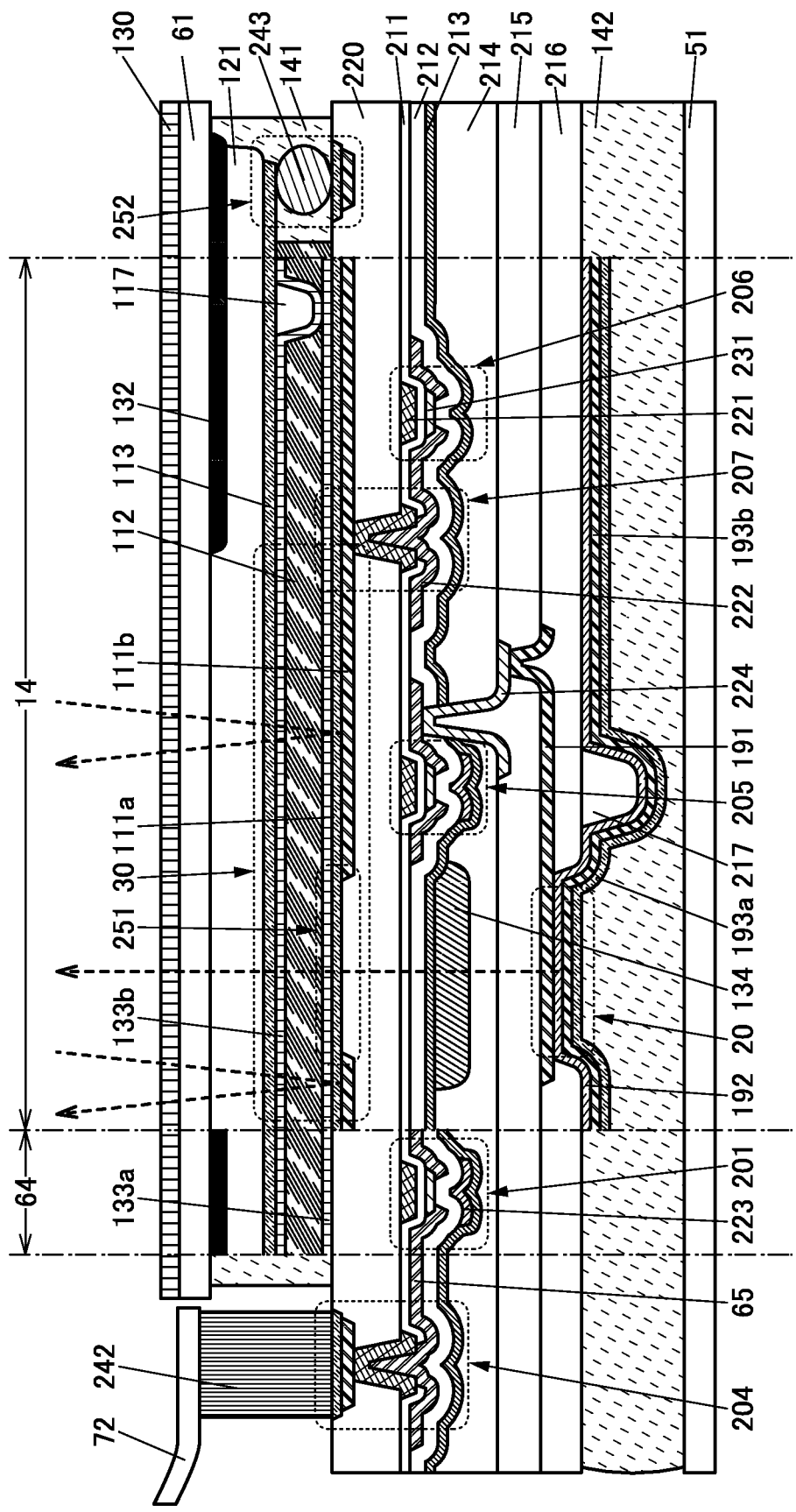
FIG. 14 is a cross-sectional view illustrating a display device.

FIG. 14 shows an example of cross sections of part of a region including the FPC 72, part of a region including the circuit 64, and part of a region including the display region 14 of the display panel illustrated in FIG. 13.

The display panel includes an insulating layer 220 between the substrates 51 and 61. The display panel also includes the first display element 20, a transistor 201, a transistor 205, a transistor 206, a coloring layer 134, and the like between the substrate 51 and the insulating layer 220. Furthermore, the display panel includes the second display element 30 functioning as a liquid crystal element and the like between the insulating layer 220 and the substrate 61. The substrate 61 and the insulating layer 220 are bonded with an adhesive layer 141. The substrate 51 and the insulating layer 220 are bonded with an adhesive layer 142.

The transistor 206 is electrically connected to the second display element 30, and the transistor 205 is electrically connected to the first display element 20. Since the transistors 205 and 206 are formed on a surface of the insulating layer 220 which is on the substrate 51 side, the transistors 205 and 206 can be formed through the same process.

A light-blocking layer 132, an insulating layer 121, a conductive layer 113 functioning as a common electrode of the second display element 30, an alignment film 133b, an insulating layer 117, and the like are provided over the substrate 61. The insulating layer 117 functions as a spacer for holding a cell gap of the second display element 30.

Insulating layers such as an insulating layer 211, an insulating layer 212, an insulating layer 213, an insulating layer 214, an insulating layer 215, and the like are provided on the substrate 51 side of the insulating layer 220. Part of the insulating layer 211 functions as a gate insulating layer of each transistor. The insulating layer 212, the insulating layer 213, and the insulating layer 214 are provided to cover each transistor. The insulating layer 215 is provided to cover the insulating layer 214. The insulating layers 214 and 215 each function as a planarization layer. Note that an example where the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided.

The insulating layer 214 functioning as a planarization layer is not necessarily provided when not needed.

The transistors 201, 205, and 206 each include a conductive layer 221 part of which functions as a gate, conductive layers 222 part of which functions as a source and a drain, and a semiconductor layer 231. Here, a plurality of layers obtained by processing the same conductive film are shown with the same hatching pattern.

The first display element 20 is a bottom-emission light-emitting element. The first display element 20 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b includes a material reflecting visible light, and the conductive layers 191 and 193a include a material transmitting visible light. Light is emitted from the first display element 20 to the substrate 61 side through the coloring layer 134, the insulating layer 220, an opening 251, the conductive layer 113, and the like.

The second display element 30 is a reflective liquid crystal element. The second display element 30 has a structure in which a conductive layer 111a, liquid crystal 112, and a conductive layer 113 are stacked. A conductive layer 111b which reflects visible light is provided in contact with the surface of the conductive layer 111a that faces the substrate 51. The conductive layer 111b includes an opening 251. The conductive layers 111a and 113 include a material transmitting visible light. In addition, an alignment film 133a is provided between the liquid crystal 112 and the conductive layer 111a, and an alignment film 133b is provided between the liquid crystal 112 and the conductive layer 113. A polarizing plate 130 is provided on an outer surface of the substrate 61.

In the second display element 30, the conductive layer 111b has a function of reflecting visible light, and the conductive layer 113 has a function of transmitting visible light. Light incident from the substrate 61 side is polarized by the polarizing plate 130, passes through the conductive layer 113 and the liquid crystal 112, and is reflected by the conductive layer 111b. Then, the light passes through the liquid crystal 112 and the conductive layer 113 again and reaches the polarizing plate 130. In this case, alignment of the liquid crystal 112 is controlled with a voltage that is applied between the conductive layer 111b and the conductive layer 113, and thus optical modulation of light can be controlled. That is, the intensity of light emitted through the polarizing plate 130 can be controlled.

Note that a coloring layer may be provided so as to be sandwiched between the substrate 61 and the insulating layer 121. In that case, the display portion 14b including the second display element 30 can perform color display.

Here, as illustrated in FIG. 14, the conductive layer 111a transmitting visible light is preferably provided for the opening 251. Accordingly, the liquid crystal 112 is aligned in a region overlapping with the opening 251 as well as in the other regions, in which case an alignment defect of the liquid crystal is prevented from being generated in the boundary portion of these regions and undesired light leakage can be suppressed.

As the polarizing plate 130 provided on an outer surface of the substrate 61, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the second display element 30 are controlled depending on the kind of the polarizing plate so that desirable contrast is obtained.

An insulating layer 217 is provided on the insulating layer 216 covering an end portion of the conductive layer 191. The insulating layer 217 has a function as a spacer for preventing the insulating layer 220 and the substrate 51 from getting closer more than necessary. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is formed. Note that the insulating layer 217 is not necessarily provided.

One of a source and a drain of the transistor 205 is electrically connected to the conductive layer 191 of the first display element 20 through a conductive layer 224.

One of a source and a drain of the transistor 206 is electrically connected to the conductive layer 111b via a connection portion 207. The conductive layers 111b and 111a are in contact with and electrically connected to each other. Here, in the connection portion 207, the conductive layers provided on both surfaces of the insulating layer 220 are connected to each other through openings in the insulating layer 220.

The connection portion 204 is provided in a region where the substrates 51 and 61 do not overlap with each other. The connection portion 204 is electrically connected to the FPC 72 via a connection layer 242. The connection portion 204 has a structure similar to that of the connection portion 207. On the top surface of the connection portion 204, a conductive layer obtained by processing the same conductive film as the conductive layer 111a is exposed. Thus, the connection portion 204 and the FPC 72 can be electrically connected to each other via the connection layer 242.

A connection portion 252 is provided in part of a region where the adhesive layer 141 is provided. In the connection portion 252, the conductive layer obtained by processing the same conductive film as the conductive layer 111a is electrically connected to part of the conductive layer 113 with a connector 243. Accordingly, a signal or a potential input from the FPC 72 connected to the substrate 51 side can be supplied to the conductive layer 113 formed on the substrate 61 side via the connection portion 252.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 14, the connector 243 which is the conductive particle has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

FIG. 14 illustrates an example of the circuit 64 in which the transistor 201 is provided.

The structure in which the semiconductor layer 231 where a channel is formed is provided between two gates is used as an example of the transistors 201 and 205 in FIG. 14. One gate is formed by the conductive layer 221 and the other gate is formed by a conductive layer 223 overlapping with the semiconductor layer 231 with the insulating layer 212 provided therebetween. Such a structure enables control of threshold voltages of transistors. In that case, the two gate electrodes may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or definition.

Note that the transistor included in the circuit 64 and the transistor included in the display portion 14 may have the same structure. A plurality of transistors included in the circuit 64 may have the same structure or different structures. A plurality of transistors included in the display portion 14 may have the same structure or different structures.

A material through which impurities such as water or hydrogen do not easily diffuse is preferably used for at least one of the insulating layers 212 and 213 which cover the transistors. That is, the insulating layer 212 or the insulating layer 213 can function as a barrier film. Such a structure can effectively prevent diffusion of the impurities into the transistors from the outside, and a highly reliable display panel can be provided.

The insulating layer 121 is provided on the substrate 61 side to cover the light-blocking layer 132. The insulating layer 121 may have a function of a planarization layer. The insulating layer 121 enables the conductive layer 113 to have an almost flat surface, resulting in a uniform alignment state of the liquid crystal 112.

An example of the method for manufacturing the display panel 100 is described. For example, the conductive layer 111a, the conductive layer 111b, and the insulating layer 220 are formed in order over a support substrate provided with a separation layer, and the transistor 205, the transistor 206, the first display element 20, and the like are formed. Then, the substrate 51 and the support substrate are bonded with the adhesive layer 142. After that, separation is performed at the interface between the separation layer and each of the insulating layer 220 and the conductive layer 111a, whereby the support substrate and the separation layer are removed. Separately, the light-blocking layer 132, the conductive layer 113, and the like are formed over the substrate 61 in advance. Then, the liquid crystal 112 is dropped onto the substrate 51 or 61 and the substrates 51 and 61 are bonded with the adhesive layer 141, whereby the display panel 100 can be manufactured.

A material for the separation layer can be selected such that separation at the interface with the insulating layer 220 and the conductive layer 111a occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer 220 over the separation layer. The use of the high-melting-point metal material for the separation layer can increase the formation temperature of a layer formed in a later step, which reduces impurity concentration and achieves a highly reliable display panel.

As the conductive layer 111a, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 111a.

The above components are described below.

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be decreased by using a thin substrate. A flexible display panel can be obtained by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 200 μm, further preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. An insulating film may be formed by, for example, a coating method such as a spin-coating method and a dipping method, an electrodeposition method, an evaporation method, or a sputtering method. An oxide film may be formed over the substrate surface by a known method such as an anodic oxidation method, exposing to or heating in an oxygen atmosphere, or the like.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). It is particularly preferable to use a material with a low thermal expansion coefficient, for example, a material with a thermal expansion coefficient lower than or equal to $30\times10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state leakage current of the transistor can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display panel which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current and therefore can hold charges stored in a capacitor that is series-connected to the transistor for a long time. When such a transistor is used for a pixel, operation of a driver circuit can be stopped while the gray scale of an image displayed on each display region is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor contained in the semiconductor layer is preferably 2 eV or more, further preferably 2.5 eV or more, and still further preferably 3 eV or more. With the use of an oxide semiconductor having such a wide energy gap, the off-state current of the transistor can be reduced.

In the case where the oxide semiconductor contained in the semiconductor layer contains an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

An oxide semiconductor film with low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen which is measured by secondary ion mass spectrometry is preferably set to lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where the display portion with extremely high definition is provided, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single-crystal silicon, or the like is particularly preferable.

As materials for a gate, a source, and a drain of a transistor, and a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and a conductive layer (e.g., a conductive layer functioning as a pixel electrode or a common electrode) included in a display element.

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], and still further preferably lower than or equal to $1 \times 10^{-8}$ [g/m$^2$·day].

As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element may be a top emission, bottom emission, dual emission light-emitting element, or the like. A conductive film that transmits visible light is used as the electrode through which light is extracted. A conductive film that reflects visible light is preferably used as the electrode through which light is not extracted.

In one embodiment of the present invention, in particular, a bottom-emission light-emitting element can be used.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of liquid crystal. Note that optical modulation action of liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

In addition, to control the alignment of the liquid crystal, an alignment film can be provided. Alternatively, when a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, the reflective liquid crystal element can be used.

In the case where the transmissive or semi-transmissive liquid crystal element is used, two polarizing plates are provided so that a pair of substrates is sandwiched therebetween. A backlight is provided outside the polarizing plate. As the backlight, a direct-below backlight or an edge-light backlight may be used. The direct-below backlight including an LED is preferably used because local dimming is easily performed to improve contrast. The edge-light type backlight is preferably used because the thickness of a module including the backlight can be reduced.

In the case where the reflective liquid crystal element is used, the polarizing plate is provided on the display surface side. Separately, a light diffusion plate is preferably provided on the display surface to improve visibility.

In the case where the reflective or the semi-transmissive liquid crystal element is used, a front light may be provided outside the polarizing plate. As the front light, an edge-light front light is preferably used. A front light including an LED is preferably used because power consumption can be reduced.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stack of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

As the connection layers, an anisotropic conductive film (ACF), an anisotropic conductive paste (ACP), or the like can be used.

Examples of a material that can be used for the coloring layer include a metal material, a resin material, and a resin material containing a pigment or dye.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed.

It is preferable that the coloring layer and the light-blocking layer be formed using the same material because the same manufacturing apparatus can be used and the process can be simplified.

The above is the description of the components.

Next, a manufacturing method example of a display panel using a flexible substrate is described.

Here, layers each including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a higher reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

As the method for separating the support substrate from the element layer, applying mechanical force, etching the separation layer, and making a liquid permeate the separation interface are given as examples. Alternatively, separation may be performed by heating or cooling the support substrate by utilizing a difference in thermal expansion coefficient of two layers which form the separation interface.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat generation layer may be provided between the support substrate and the insulating layer formed of an organic resin, and separation may be performed at an interface between the heat generation layer and the insulating layer by heating the heat generation layer. As the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a display panel with a flexible substrate.

Next, the positions of the first display element 20 and the opening 251 in each pixel 19 illustrated in FIG. 2 and the like are described.

Figure 15A:
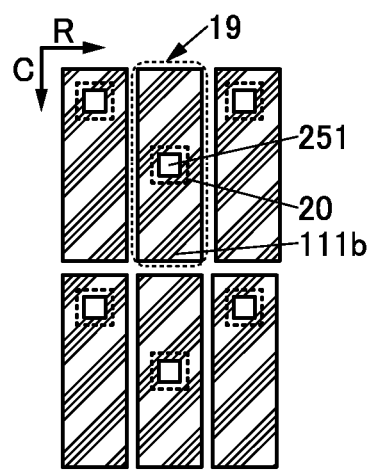
FIGS. 15A and 15B are top views illustrating the positions of openings.

FIG. 15A is a top view illustrating a structure example of the conductive layers 111b included in the pixels 19. As described above, the conductive layer 111b functions as a reflective electrode of the liquid crystal element in the pixel 19. The conductive layer 111b includes the opening 251, as mentioned above.

Figure 15B:
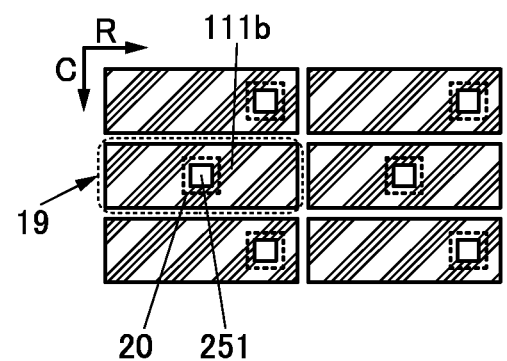

In FIGS. 15A and 15B, a direction R is parallel to the wirings G1 and G2 shown in FIG. 1A and the like, and a direction C is parallel to the wirings S1 and S2 shown in FIG. 1A and the like.

In FIG. 15A, the first display element 20 in a region overlapping with the conductive layer 111b is denoted by a dashed line. The first display element 20 overlaps with the opening 251 included in the conductive layer 111b, as described above.

In FIG. 15A, the pixels 19 adjacent in the direction R correspond to different colors. As illustrated in FIG. 15A, the openings 251 are preferably provided in different positions in the conductive layers 111b so as not to be aligned in the two pixels adjacent to each other in the direction R. This allows two adjacent first display elements 20 to be apart from each other, thereby preventing light emitted from the first display element 20 from entering a coloring layer in the adjacent pixel 19 (such a phenomenon is also referred to as crosstalk). Furthermore, since the two adjacent first display elements 20 can be arranged apart from each other, a high-resolution display panel is achieved even when EL layers of the first display elements 20 are separately formed with a shadow mask or the like.

Alternatively, arrangement illustrated in FIG. 15B may be employed.

If the ratio of the total area of the opening 251 to the total area except for the opening is too large, display performed using the liquid crystal element is dark. If the ratio of the total area of the opening 251 to the total area except for the opening is too small, display performed using the first display element 20 is dark.

If the area of the opening 251 in the conductive layer 111b serving as a reflective electrode is too small, light emitted from the first display element 20 is not efficiently extracted for display.

The shape of the opening 251 can be, for example, polygonal, quadrangular, elliptical, circular, or cross-shaped. Alternatively, the opening 251 may have a stripe shape, a slit shape, or a checkered pattern. The opening 251 may be close to the adjacent pixel. Preferably, the opening 251 is provided close to another pixel emitting light of the same color, in which case crosstalk can be suppressed.

At least part of this embodiment can be implemented in combination with any of the other embodiments described in this specification as appropriate.

(Embodiment 3)

In this embodiment, an example of a transistor that can be used as the transistors described in the above embodiments is described with reference to drawings.

The display device of one embodiment of the present invention can be fabricated by using a transistor with any of various modes, such as a bottom-gate transistor or a top-gate transistor. Therefore, a material for a semiconductor layer or the structure of a transistor can be easily changed in accordance with the existing production line.

FIG. 16A1 is a cross-sectional view of a transistor 810 that is a channel-protective transistor, which is a type of bottom-gate transistor. In FIG. 16A1, the transistor 810 is formed over a substrate 771. The transistor 810 includes a conductive layer 746 over the substrate 771 with an insulating layer 772 provided therebetween. The transistor 810 includes a semiconductor layer 742 over the conductive layer 746 with an insulating layer 726 provided therebetween. The conductive layer 746 can serve as a gate electrode. The insulating layer 726 can serve as a gate insulating layer.

The transistor 810 includes an insulating layer 741 over a channel formation region in the semiconductor layer 742. The transistor 810 includes a conductive layer 744a and a conductive layer 744b which are partly in contact with the semiconductor layer 742 and over the insulating layer 726. The conductive layer 744a can serve as one of a source electrode and a drain electrode. The conductive layer 744b can serve as the other of the source electrode and the drain electrode. Part of the conductive layer 744a and part of the conductive layer 744b are formed over the insulating layer 741.

The insulating layer 741 can serve as a channel protective layer. With the insulating layer 741 provided over the channel formation region, the semiconductor layer 742 can be prevented from being exposed at the time of forming the conductive layers 744a and 744b. Thus, the channel formation region in the semiconductor layer 742 can be prevented from being etched at the time of forming the conductive layers 744a and 744b. According to one embodiment of the present invention, a transistor with favorable electrical characteristics can be provided.

The transistor 810 includes an insulating layer 728 over the conductive layer 744a, the conductive layer 744b, and the insulating layer 741 and further includes an insulating layer 729 over the insulating layer 728.

Note that the insulating layers 772, 726, 741, 728, and 729 may each be formed of a stack of insulating layers. The semiconductor layer 742 may be formed of a stack of semiconductor layers. The conductive layers 746, 744a, and 744b may each be formed of a stack of conductive layers.

The conductive layer, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the conductive layers 744a and 744b that are in contact with at least the semiconductor layer 742. The carrier concentration in the regions of the semiconductor layer 742 where oxygen vacancies are generated is increased, so that the regions become n-type regions (n$^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the conductive layers 744a and 744b. Accordingly, the electric characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and the conductive layer 744a and between the semiconductor layer 742 and the conductive layer 744b. The layer that serves as an n-type semiconductor or a p-type semiconductor can serve as the source region or the drain region in the transistor.

The insulating layer 729 is preferably formed using a material that can prevent or reduce diffusion of impurities into the transistor from the outside. The insulating layer 729 is not necessarily formed.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can be further classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 811 illustrated in FIG. 16A2 is different from the transistor 810 in that a conductive layer 723 that can serve as a back gate electrode is provided over the insulating layer 729. The conductive layer 723 can be formed using a material and a method similar to those of the conductive layer 746.

In general, the back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The conductive layer 746 and the conductive layer 723 can each serve as a gate electrode. Thus, the insulating layers 726, 728, and 729 can each serve as a gate insulating layer. The conductive layer 723 may also be provided between the insulating layers 728 and 729.

In the case where one of the conductive layers 746 and 723 is referred to as a "gate electrode", the other is referred to as a "back gate electrode". For example, in the transistor 811, in the case where the conductive layer 723 is referred to as a "gate electrode", the conductive layer 746 is referred to as a "back gate electrode". In the case where the conductive layer 723 is used as a "gate electrode", the transistor 811 can be regarded as a kind of top-gate transistor. Alternatively, one of the conductive layers 746 and 723 may be referred to as a "first gate electrode", and the other may be referred to as a "second gate electrode".

By providing the conductive layers 746 and 723 with the semiconductor layer 742 provided therebetween and setting the potentials of the conductive layers 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area occupied by a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the conductive layers 746 and 723 each have a function of blocking an electric field generated outside, electric charge of charged particles and the like generated on the insulating layer 772 side or above the conductive layer 723 do not influence the channel formation region in the semiconductor layer 742. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the conductive layers 746 and 723 have the same potential or different potentials.

The BT stress test is one kind of acceleration test and can evaluate, in a short time, a change by long-term use (i.e., a change over time) in characteristics of a transistor. In particular, the amount of change in the threshold voltage of a transistor before and after the BT stress test is an important indicator when examining the reliability of the transistor. As the change in threshold voltage is smaller, the transistor has higher reliability.

By providing the conductive layers 746 and 723 and setting the potentials of the conductive layers 746 and 723 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 16B1 is a cross-sectional view of a channel-protective transistor 820 that is a type of bottom-gate transistor. The transistor 820 has substantially the same structure as the transistor 810 but is different from the transistor 810 in that the insulating layer 741 covers an end portion of the semiconductor layer 742. The semiconductor layer 742 is electrically connected to the conductive layer 744a through an opening formed by selectively removing part of the insulating layer 741 which overlaps with the semiconductor layer 742. The semiconductor layer 742 is electrically connected to the conductive layer 744b through another opening formed by selectively removing part of the insulating layer 741 which overlaps with the semiconductor layer 742. A region of the insulating layer 741 which overlaps with the channel formation region can serve as a channel protective layer.

A transistor 821 illustrated in FIG. 16B2 is different from the transistor 820 in that the conductive layer 723 that can serve as a back gate electrode is provided over the insulating layer 729.

With the insulating layer 741, the semiconductor layer 742 can be prevented from being exposed at the time of forming the conductive layers 744a and 744b. Thus, the semiconductor layer 742 can be prevented from being reduced in thickness at the time of forming the conductive layers 744a and 744b.

The length between the conductive layer 744a and the conductive layer 746 and the length between the conductive layer 744b and the conductive layer 746 in the transistors 820 and 821 are larger than those in the transistors 810 and 811. Thus, the parasitic capacitance generated between the conductive layer 744a and the conductive layer 746 can be reduced. Moreover, the parasitic capacitance generated between the conductive layer 744b and the conductive layer 746 can be reduced. According to one embodiment of the present invention, a transistor with favorable electrical characteristics can be provided.

A transistor 825 illustrated in FIG. 16C1 is a channel-etched transistor that is a type of bottom-gate transistor. In the transistor 825, the conductive layers 744a and 744b are formed without providing the insulating layer 741. Thus, part of the semiconductor layer 742 that is exposed at the time of forming the conductive layers 744a and 744b is etched in some cases. However, since the insulating layer 741 is not provided, the productivity of the transistor can be increased.

A transistor 826 illustrated in FIG. 16C2 is different from the transistor 825 in that the conductive layer 723 which can serve as a back gate electrode is provided over the insulating layer 729.

FIG. 17A1 is a cross-sectional view of a transistor 830 that is a type of top-gate transistor. The transistor 830 includes the semiconductor layer 742 over the insulating layer 772, the conductive layers 744a and 744b that are over the semiconductor layer 742 and the insulating layer 772 and in contact with part of the semiconductor layer 742, the insulating layer 726 over the semiconductor layer 742 and the conductive layers 744a and 744b, and the conductive layer 746 over the insulating layer 726.

Since the conductive layer 746 overlaps with neither the conductive layer 744a nor the conductive layer 744b in the transistor 830, the parasitic capacitance generated between the conductive layers 746 and 744a and the parasitic capacitance generated between the conductive layers 746 and 744b can be reduced. After the formation of the conductive layer 746, an impurity 755 is introduced into the semiconductor layer 742 using the conductive layer 746 as a mask, so that an impurity region can be formed in the semiconductor layer 742 in a self-aligned manner (see FIG. 17A3). According to one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 17A2 is different from the transistor 830 in that the conductive layer 723 and the insulating layer 727 are included. The transistor 831 includes the conductive layer 723 formed over the insulating layer 772 and the insulating layer 727 formed over the conductive layer 723. The conductive layer 723 can serve as a back gate electrode. Thus, the insulating layer 727 can serve as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. According to one embodiment of the present invention, the area occupied by a transistor can be reduced. Therefore, according to one embodiment of the present invention, a semiconductor device having a high degree of integration can be provided.

A transistor 840 illustrated in FIG. 17B1 is a type of top-gate transistor. The transistor 840 is different from the transistor 830 in that the semiconductor layer 742 is formed after the formation of the conductive layers 744a and 744b. A transistor 841 illustrated in FIG. 17B2 is different from the transistor 840 in that the conductive layer 723 and the insulating layer 727 are included. In the transistors 840 and 841, part of the semiconductor layer 742 is formed over the conductive layer 744a and another part of the semiconductor layer 742 is formed over the conductive layer 744b.

Like the transistor 811, the transistor 841 has a high on-state current for its area. That is, the area of the transistor 841 can be small for a required on-state current. According to one embodiment of the present invention, the area occupied by a transistor can be reduced. Therefore, according to one embodiment of the present invention, a semiconductor device having a high degree of integration can be provided.

A transistor 842 illustrated in FIG. 18A1 is a type of top-gate transistor. The transistor 842 is different from the transistor 830 or 840 in that the conductive layers 744a and 744b are formed after the formation of the insulating layer 729. The conductive layers 744a and 744b are electrically connected to the semiconductor layer 742 through openings formed in the insulating layers 728 and 729.

Part of the insulating layer 726 that does not overlap with the conductive layer 746 is removed, and the impurity 755 is introduced into the semiconductor layer 742 using the conductive layer 746 and the insulating layer 726 that is left as a mask, so that an impurity region can be formed in the semiconductor layer 742 in a self-aligned manner (see FIG. 18A3). The transistor 842 includes a region where the insulating layer 726 extends beyond an end portion of the conductive layer 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region adjacent to part of the semiconductor layer 742 which overlaps with the conductive layer 746.

A transistor 843 illustrated in FIG. 18A2 is different from the transistor 842 in that the conductive layer 723 is included. The transistor 843 includes the conductive layer 723 that is formed over the substrate 771 and overlaps with the semiconductor layer 742 with the insulating layer 772 provided therebetween. The conductive layer 723 can serve as a back gate electrode.

As in a transistor 844 illustrated in FIG. 18B1 and a transistor 845 illustrated in FIG. 18B2, the insulating layer 726 in a region that does not overlap with the conductive layer 746 may be completely removed. Alternatively, as in a transistor 846 illustrated in FIG. 18C1 and a transistor 847 illustrated in FIG. 18C2, the insulating layer 726 may be left.

In the transistors 842 to 847, after the formation of the conductive layer 746, the impurity 755 is introduced into the semiconductor layer 742 using the conductive layer 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

At least part of this embodiment can be implemented in combination with any of the other embodiments described in this specification as appropriate.

(Embodiment 4)

In this embodiment, the composition of a cloud-aligned composite oxide semiconductor (CAC-OS) applicable to a transistor disclosed in one embodiment of the present invention is described.

The CAC-OS refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas is used as a deposition gas. Furthermore, the flow rate of the oxygen gas to the total flow rate of the deposition gas in deposition is preferably as low as possible, for example, the flow rate of the oxygen gas is higher than equal to 0% and lower than 30%, preferably higher than equal to 0% and lower than 10%.

The CAC-OS has a characteristic in that a clear peak is not observed when measurement is conducted using a θ/2θ scan by an out-of-plane method with an X-ray diffraction (XRD). That is, it is found that there are no alignment in the a-b plane direction and no alignment in the c-axis alignment in the measured areas by the XRD.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

(Embodiment 5)

In this embodiment, a display module which can be manufactured using one embodiment of the present invention is described.

Figure 19:
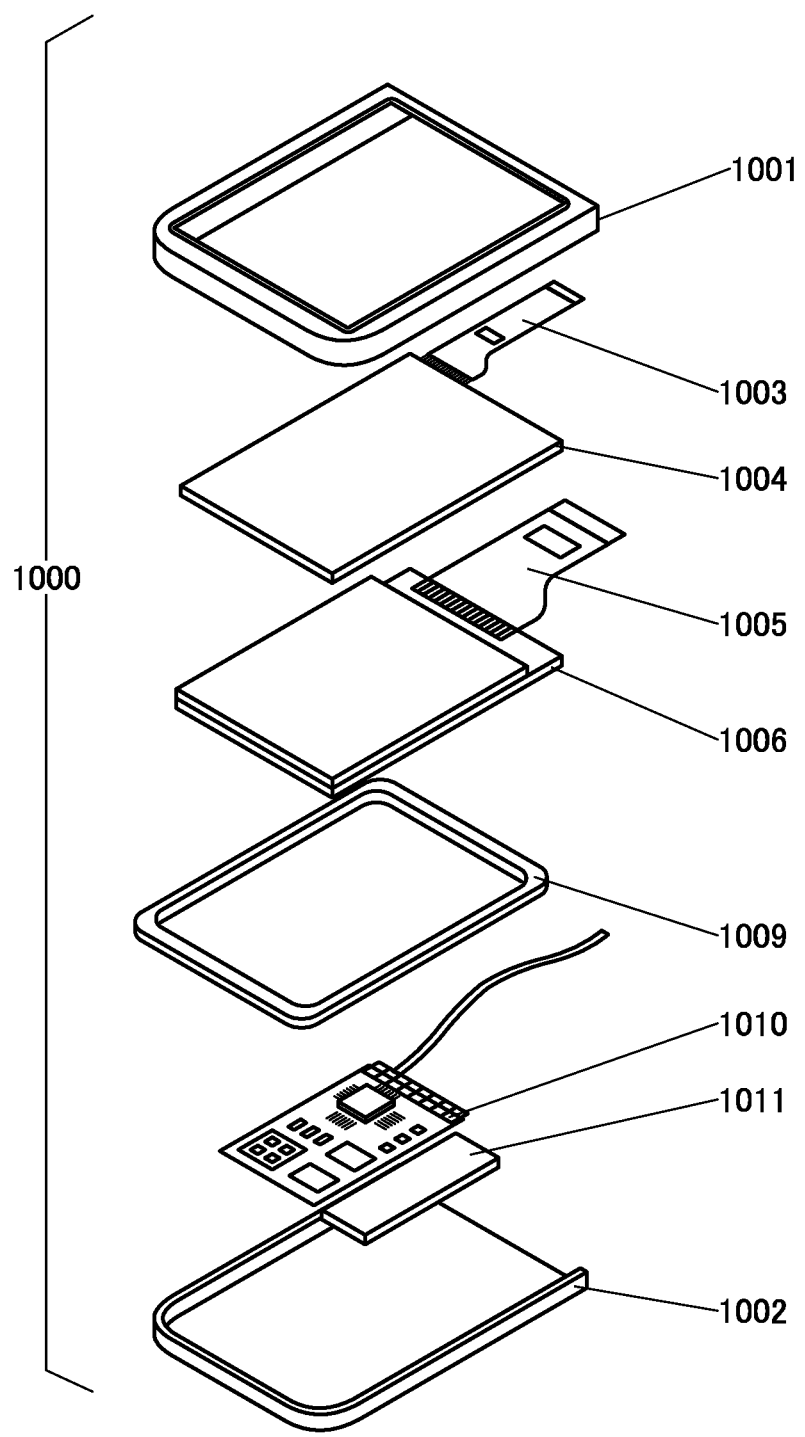
FIG. 19 illustrates a display module.

In a display module 1000 in FIG. 19, a touch panel 1004 connected to an FPC 1003, a display panel 1006 connected to an FPC 1005, a frame 1009, a printed circuit board 1010, and a battery 1011 are provided between an upper cover 1001 and a lower cover 1002.

A display device manufactured by using one embodiment of the present invention can be used for the display panel 1006, for example. Thus, high visibility can be achieved regardless of the intensity of external light The shapes and sizes of the upper cover 1001 and the lower cover 1002 can be changed as appropriate in accordance with the sizes of the touch panel 1004 and the display panel 1006.

The touch panel 1004 can be a resistive touch panel or a capacitive touch panel and may be formed to overlap with the display panel 1006. Instead of providing the touch panel 1004, the display panel 1006 can have a touch panel function.

The frame 1009 protects the display panel 1006 and also functions as an electromagnetic shield for blocking electromagnetic waves generated by the operation of the printed circuit board 1010. The frame 1009 may function as a radiator plate.

The printed circuit board 1010 is provided with a power supply circuit and a signal processing circuit for outputting a video signal and a clock signal. As a power source for supplying power to the power supply circuit, an external commercial power source or a power source using the battery 1011 provided separately may be used. The battery 1011 can be omitted in the case of using a commercial power source.

The display module 1000 may be additionally provided with a member such as a polarizing plate, a retardation plate, or a prism sheet.

At least part of this embodiment can be implemented in combination with any of the other embodiments described in this specification as appropriate.

(Embodiment 6)

In this embodiment, electronic devices to which the display device of one embodiment of the present invention can be applied are described.

The display device of one embodiment of the present invention can achieve high visibility regardless of the intensity of external light. Therefore, the display device of one embodiment of the present invention can be favorably used in portable electronic devices, wearable electronic devices (wearable devices), e-book readers, and the like.

Figure 20A:
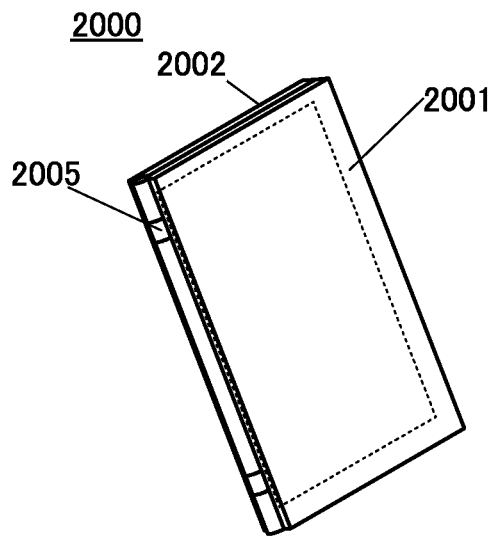
FIGS. 20A to 20D illustrate electronic devices.
Figure 20B:
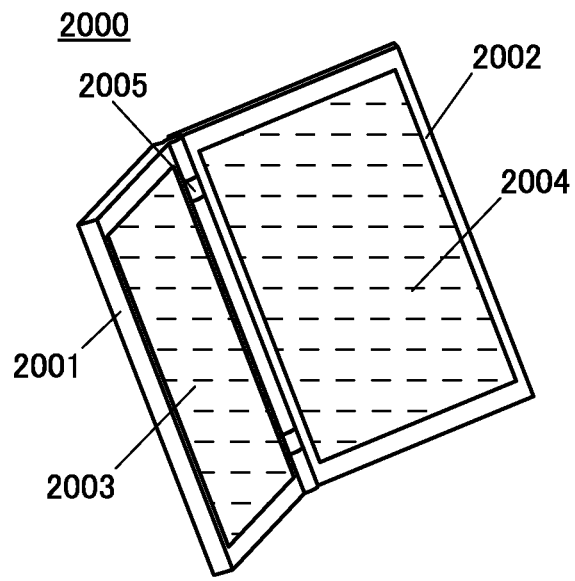

FIGS. 20A and 20B illustrate an example of a portable information terminal 2000. The portable information terminal 2000 includes a housing 2001, a housing 2002, a display portion 2003, a display portion 2004, a hinge portion 2005, and the like. The portable information terminal 2000 which uses the display device of one embodiment of the present invention can achieve high visibility regardless of the intensity of external light.

The housing 2001 and the housing 2002 are connected with the hinge portion 2005. The portable information terminal 2000 folded as in FIG. 20A can be changed into the state illustrated in FIG. 20B, in which the housing 2001 and the housing 2002 are opened.

For example, the portable information terminal 2000 can also be used as an e-book reader, in which the display portion 2003 and the display portion 2004 each can display text data. In addition, the display portion 2003 and the display portion 2004 each can display a still image or a moving image.

In this manner, the portable information terminal 2000 has high versatility because it can be folded when carried.

Note that the housing 2001 and the housing 2002 may include a power switch, an operation button, an external connection port, a speaker, a microphone, and/or the like.

Figure 20C:
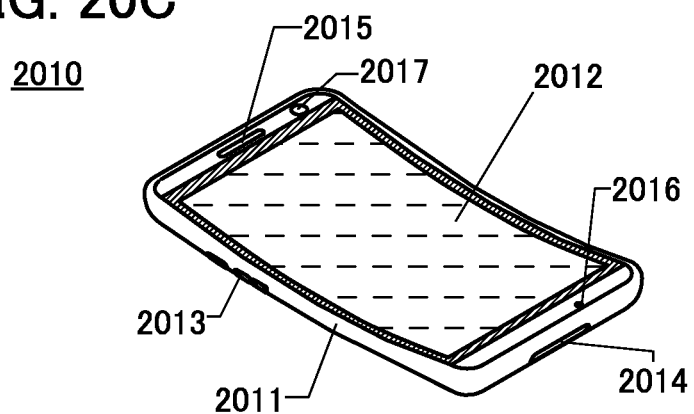

FIG. 20C illustrates an example of a portable information terminal. A portable information terminal 2010 illustrated in FIG. 20C includes a housing 2011, a display portion 2012, an operation button 2013, an external connection port 2014, a speaker 2015, a microphone 2016, a camera 2017, and the like. The portable information terminal 2010 which uses the display device of one embodiment of the present invention can achieve high visibility regardless of the intensity of external light.

The portable information terminal 2010 includes a touch sensor in the display portion 2012. Operations such as making a call and inputting a letter can be performed by touch on the display portion 2012 with a finger, a stylus, or the like.

With the operation button 2013, the power can be turned on and off. In addition, types of images displayed on the display portion 2012 can be switched; for example, switching images from a mail creation screen to a main menu screen is performed with the operation button 2013.

When a detection device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically). Furthermore, the direction of display on the screen can be changed by touch on the display portion 2012, operation with the operation button 2013, sound input using the microphone 2016, or the like.

The portable information terminal 2010 functions as, for example, one or more of a telephone set, a notebook, and an information browsing system. Specifically, the portable information terminal 2010 can be used as a smartphone. The portable information terminal 2010 is capable of executing a variety of applications such as mobile phone calls, e-mails, viewing and editing texts, playing music, replaying a video, Internet communication, and computer games.

Figure 20D:
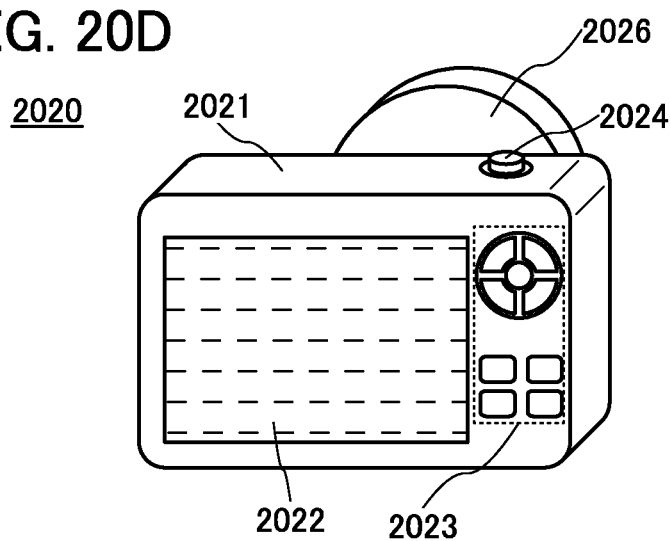

FIG. 20D illustrates an example of a camera. A camera 2020 includes a housing 2021, a display portion 2022, operation buttons 2023, a shutter button 2024, and the like. Furthermore, an detachable lens 2026 is attached to the camera 2020. The camera 2020 which uses the display device one embodiment of the present invention can achieve high visibility regardless of the intensity of external light.

Although the lens 2026 of the camera 2020 here is detachable from the housing 2021 for replacement, the lens 2026 may be included in the housing.

Still and moving images can be taken with the camera 2020 at the press of the shutter button 2024. In addition, images can be taken at the touch of the display portion 2022 which serves as a touch panel.

Note that a stroboscope, a viewfinder, and the like can be additionally attached to the camera 2020. Alternatively, these may be included in the housing 2021.

At least part of this embodiment can be implemented in combination with any of the other embodiments described in this specification as appropriate.

This application is based on Japanese Patent Application serial no. 2016-118722 filed with Japan Patent Office on Jun. 15, 2016, the entire contents of which are hereby incorporated by reference.

What is claimed is:

1. A display device comprising:
    a first circuit;
    a second circuit;
    a third circuit;
    a first display portion; and
    a second display portion,
    wherein the first circuit is configured to generate first display data,
    wherein the first circuit is configured to detect a color region of the first display data and a gray-scale region of the first display data,
    wherein the first circuit is configured to generate second display data and third display data on the basis of data relating to the color region of the first display data and data relating to the gray-scale region of the first display data,
    wherein the first circuit is configured to send the second display data to the second circuit,
    wherein the first circuit is configured to send the third display data to the second circuit,
    wherein the second circuit is configured to send the second display data received from the first circuit to the first display portion,
    wherein the second circuit is configured to send the third display data received from the first circuit to the second display portion,
    wherein the first display portion is configured to display an image corresponding to the second display data, wherein the second display portion is configured to display an image corresponding to the third display data, wherein the third circuit is configured to measure an illuminance of external light, and wherein the first display portion and the second display portion are stacked.

2. The display device according to claim 1, further comprising:

a fourth circuit; and a fifth circuit, wherein the second circuit is configured to write the second display data received from the first circuit to the fifth circuit, wherein the second circuit is configured to send the second display data read out from the fifth circuit to the first display portion, wherein the second circuit is configured to write the third display data received from the first circuit to the fourth circuit, wherein the second circuit is configured to send the third display data read out from the fourth circuit to the second display portion, wherein the fifth circuit is configured to retain the second display data, and wherein the fourth circuit is configured to retain the third display data.

3. The display device according to claim 1, wherein the first display portion comprises a plurality of first pixels arranged in a matrix, wherein the second display portion comprises a plurality of second pixels, wherein numbers of rows and columns of the second pixels are the same as numbers of rows and columns of the first pixels, wherein the first circuit is configured to divide the first display data into first regions arranged in the same number of rows and the same number of columns as the first pixels and the second pixels, wherein the first circuit is configured to detect the first region that is a gray-scale region or a color region by raster scanning, wherein the first circuit is configured to label the first region detected by the raster scanning, wherein the first circuit is configured to detect another first region that is a gray-scale region or a color region which has different coordinates from the labeled first region by k-neighbor searching centering on the labeled first region, wherein k is an integer, and wherein the first circuit is configured to label the first region detected by the k-neighbor searching.

4. The display device according to claim 3, wherein k is eight or four.

5. The display device according to claim 3, wherein the first circuit is configured to count a number of the labeled first regions.

6. The display device according to claim 1, wherein the second display data comprises data relating to the color region of the first display data, and wherein the third display data comprises data relating to the gray-scale region of the first display data.

7. The display device according to claim 1, wherein the second display data and the third display data comprise the data relating to the color region of the first display data when the illuminance of external light is higher than or equal to a first illuminance, wherein only the second display data comprises the data relating to the color region of the first display data when the illuminance of external light is lower than the first illuminance, wherein only the third display data comprises the data relating to the gray-scale region of the first display data when the illuminance of external light is higher than or equal to a second illuminance, and wherein the second display data and the third display data comprise the data relating to the gray-scale region of the first display data when the illuminance of external light is lower than the second illuminance.

8. The display device according to claim 1, wherein the first circuit is configured to convert the color region of the first display data into a gray-scale region and generate the third display data on the basis of the first display data obtained by the conversion.

9. The display device according to claim 8, wherein the first circuit is configured to convert the color region of the first display data into a gray-scale region by an NTSC weighted average method.

10. The display device according to claim 1, wherein the first display portion comprises a first display element, wherein the second display portion comprises a second display element, wherein the first display element comprises a light-emitting layer, and wherein the second display element comprises a liquid crystal layer.

11. The display device according to claim 10, wherein the light-emitting layer is an organic EL layer.

12. An electronic device comprising:

the display device according to claim 1; and an operation key.

13. A display device comprising:

a first circuit;

a second circuit;

a third circuit;

a fourth circuit;

a first display portion; and a second display portion, wherein the first circuit is configured to generate first display data, wherein the first circuit is configured to detect a color region of the first display data and a gray-scale region of the first display data, wherein the first circuit is configured to generate second display data and third display data on the basis of data relating to the color region of the first display data and data relating to the gray-scale region of the first display data, wherein the first circuit is configured to send the second display data to the second circuit, wherein the first circuit is configured to send the third display data to the third circuit, wherein the second circuit is configured to send the second display data received from the first circuit to the first display portion, wherein the third circuit is configured to send the third display data received from the first circuit to the second display portion, wherein the first display portion is configured to display an image corresponding to the second display data, wherein the second display portion is configured to display an image corresponding to the third display data, wherein the fourth circuit is configured to measure an illuminance of external light, and wherein the first display portion and the second display portion are stacked.

14. The display device according to claim 13, further comprising:
a fifth circuit; and
a sixth circuit,
wherein the second circuit is configured to write the second display data received from the first circuit to the sixth circuit,
wherein the second circuit is configured to send the second display data read out from the sixth circuit to the first display portion,
wherein the third circuit is configured to write the third display data received from the first circuit to the fifth circuit,
wherein the third circuit is configured to send the third display data read out from the fifth circuit to the second display portion,
wherein the sixth circuit is configured to retain the second display data, and
wherein the fifth circuit is configured to retain the third display data.

15. The display device according to claim 13,
wherein the first display portion comprises a plurality of first pixels arranged in a matrix,
wherein the second display portion comprises a plurality of second pixels,
wherein numbers of rows and columns of the second pixels are the same as numbers of rows and columns of the first pixels,
wherein the first circuit is configured to divide the first display data into first regions arranged in the same number of rows and the same number of columns as the first pixels and the second pixels,
wherein the first circuit is configured to detect the first region that is a gray-scale region or a color region by raster scanning,
wherein the first circuit is configured to label the first region detected by the raster scanning,
wherein the first circuit is configured to detect another first region that is a gray-scale region or a color region which has different coordinates from the labeled first region by k-neighbor searching centering on the labeled first region,
wherein k is an integer, and
wherein the first circuit is configured to label the first region detected by the k-neighbor searching.

16. The display device according to claim 15, wherein k is eight or four.

17. The display device according to claim 15, wherein the first circuit is configured to count a number of the labeled first regions.

18. The display device according to claim 13,
wherein the second display data comprises data relating to the color region of the first display data, and
wherein the third display data comprises data relating to the gray-scale region of the first display data.

19. The display device according to claim 13,
wherein the second display data and the third display data comprise the data relating to the color region of the first display data when the illuminance of external light is higher than or equal to a first illuminance, wherein only the second display data comprises the data relating to the color region of the first display data when the illuminance of external light is lower than the first illuminance, wherein only the third display data comprises the data relating to the gray-scale region of the first display data when the illuminance of external light is higher than or equal to a second illuminance, and wherein the second display data and the third display data comprise the data relating to the gray-scale region of the first display data when the illuminance of external light is lower than the second illuminance.

20. The display device according to claim 13, wherein the first circuit is configured to convert the color region of the first display data into a gray-scale region and generate the third display data on the basis of the first display data obtained by the conversion.

21. The display device according to claim 20, wherein the first circuit is configured to convert the color region of the first display data into a gray-scale region by an NTSC weighted average method.

22. The display device according to claim 13,
wherein the first display portion comprises a first display element,
wherein the second display portion comprises a second display element,
wherein the first display element comprises a light-emitting layer, and
wherein the second display element comprises a liquid crystal layer.

23. The display device according to claim 22, wherein the light-emitting layer is an organic EL layer.

24. An electronic device comprising:
the display device according to claim 13; and
an operation key.

25. A method for operating a display device, comprising:
a first step of generating display data;
a second step of dividing the display data into regions arranged in a matrix;
a third step of initializing a variable and a counter including a plurality of array variables;
a fourth step of detecting the region that is an unlabeled gray-scale region by raster scanning;
a fifth step of interrupting the raster scanning when the region that is an unlabeled gray-scale is detected in the fourth step;
a sixth step of labeling the region that is an unlabeled gray-scale region and detected in the fourth step, with the variable as a label number;
a seventh step of performing increment on the array variables including the variable in an index;
an eighth step of performing 8- or 4-neighbor searching centering on the region labeled in the sixth step to detect the region which is an unlabeled gray-scale region;
a step of returning to the sixth step when the region that is an unlabeled gray-scale region is detected in the eighth step;
a ninth step of performing increment on the variable when the region that is an unlabeled gray-scale region is not detected in the eighth step;
a tenth step of resuming the raster scanning from the region in which the raster scanning is interrupted in the fifth step and detecting the region that is an unlabeled gray-scale region; and a step of returning to the sixth step when the region that is an unlabeled gray-scale region is detected in the tenth step.

* * * * *